United States Patent
Choi

(10) Patent No.: US 10,141,931 B2
(45) Date of Patent: Nov. 27, 2018

(54) MEMORY DEVICE, MEMORY SYSTEM INCLUDING THE SAME, AND SLEW RATE CALIBRATION METHOD THEREOF

(71) Applicant: Samsung Electronics Co., Ltd., Suwon-si (KR)

(72) Inventor: Hun-Dae Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 10 days.

(21) Appl. No.: 15/689,855

(22) Filed: Aug. 29, 2017

(65) Prior Publication Data

US 2018/0131374 A1 May 10, 2018

(30) Foreign Application Priority Data

Nov. 7, 2016 (KR) .......................... 10-2016-0147678

(51) Int. Cl.
| | |
|---|---|
| *H03K 17/16* | (2006.01) |
| *H03K 19/003* | (2006.01) |
| *H03K 19/00* | (2006.01) |
| *H03K 3/011* | (2006.01) |

(52) U.S. Cl.
CPC ......... *H03K 19/0005* (2013.01); *H03K 3/011* (2013.01)

(58) Field of Classification Search
None
See application file for complete search history.

(56) References Cited

U.S. PATENT DOCUMENTS

| | | | |
|---|---|---|---|
| 6,229,336 B1 | 5/2001 | Felton et al. | |
| 6,237,107 B1 | 5/2001 | Williams et al. | |
| 6,441,653 B1 | 8/2002 | Spurlin | |
| 6,452,428 B1 | 9/2002 | Mooney et al. | |
| 7,248,088 B2 * | 7/2007 | Hargan | H03K 5/01 327/170 |
| 7,446,576 B2 | 11/2008 | Fiedler | |
| 7,884,647 B2 * | 2/2011 | Kim | H03K 19/018528 326/17 |
| 8,564,326 B2 | 10/2013 | Liu et al. | |
| 8,750,391 B2 | 6/2014 | Terauchi | |
| 9,337,807 B2 | 5/2016 | Hollis et al. | |
| 2008/0094112 A1 * | 4/2008 | Tanaka | H03K 17/164 327/108 |
| 2017/0011785 A1 * | 1/2017 | Berge | G06F 13/16 |

FOREIGN PATENT DOCUMENTS

KR  2009-0069668 A  7/2009

* cited by examiner

*Primary Examiner* — Anh Tran
(74) *Attorney, Agent, or Firm* — Muir Patent Law, PLLC

(57) ABSTRACT

A memory device includes a main driver and a pre-driver. The main driver provides an output signal to a host based on a plurality of driving signals. The pre-driver provides the main driver with the plurality of driving signals in order to calibrate a slew rate of the output signal based on an output resistance value of the main driver and a resistance value of an on-die termination circuit of the host. The pre-driver is configured to generate a first driving signal of the plurality of driving signals in response to an input signal regardless of a control signal, and to generate a second driving signal of the plurality of driving signals in response to the input signal and the control signal.

20 Claims, 19 Drawing Sheets

MEMORY DEVICE, MEMORY SYSTEM INCLUDING THE SAME, AND SLEW RATE CALIBRATION METHOD THEREOF

CROSS-REFERENCE TO RELATED APPLICATIONS

This U.S. non-provisional patent application claims priority under 35 U.S.C. § 119 to Korean Patent Application No. 10-2016-0147678 filed Nov. 7, 2016, in the Korean Intellectual Property Office, the entire contents of which are hereby incorporated by reference.

BACKGROUND

Exemplary embodiments relate to a semiconductor memory device, and more particularly, to a memory device, a memory system including the same, and a slew rate calibration method thereof.

According to a mobile trend, high integration, high performance, and low power are desirable for semiconductor memory devices. As a high-performance memory device operates at a very high speed, higher signal quality and stability are desirable. Using a termination resistor is one of methods for the high signal quality and stability.

The termination resistor is an element for impedance matching between the inside and the outside of the memory system to reduce reflection of a data signal and to prevent a decrease in quality of the data signal. A termination circuit that includes the termination resistor may be mainly used in a dynamic random access memory (DRAM) that operates at a high speed. In recent years, an on-die termination technology for locating the termination resistor to the inside of the DRAM has been used to prevent signal interference between DRAMs.

Memory devices are desirable to support various signaling schemes for satisfying various standards or interfaces upon communicating with a host. The standards or interfaces may define an on-die termination scheme and an output resistance value of a memory device. As such, memory devices may be designed to provide various output resistance values. With the above description, memory devices drive various on-die termination schemes and maintain the quality of output data while providing an output resistance value that a system needs.

SUMMARY

Exemplary embodiments provide a memory device that improves the quality of output signals by calibrating a slew rate, a memory system including the same, and a slew rate calibration method thereof.

According to an aspect of an embodiment, a memory device includes a main driver and a pre-driver. The main driver provides an output signal to a host based on a plurality of driving signals. The pre-driver provides the main driver with the plurality of driving signals in order to calibrate a slew rate of the output signal based on an output resistance value of the main driver and a resistance value of an on-die termination circuit of the host. The pre-driver is configured to generate a first driving signal of the plurality of driving signals in response to an input signal regardless of a control signal, and to generate a second driving signal of the plurality of driving signals in response to the input signal and the control signal.

According to another aspect of an embodiment, a slew rate calibration method of a memory device includes measuring, at a host, a common voltage level of an output signal of a main driver included in the memory device, by calibrating a slew rate of the output signal based on an output resistance value of the main driver and a resistance value of an on-die termination circuit included in the host, and storing information of a slew rate combination of the output signal, which is generated based on the measurement result, in a mode register included in the memory device.

According to another aspect of an embodiment, a memory system includes a memory device and a memory controller. The memory device includes a main driver and calibrates a slew rate of an output signal that is generated by the main driver based on information of a slew rate combination. The memory controller measures a common voltage level of the output signal based on an output resistance value of the main driver and a resistance value of an on-die termination circuit of the memory controller and generates information of a slew rate combination of the output signal based on the measurement result to allow a common voltage level of the output signal to be matched with a level of a reference voltage of the memory controller.

According to another aspect of an embodiment, a memory device includes a main driver and a pre-driver. The main driver is configured to provide an output signal in response to a driving signal. The pre-driver may include a plurality of delay paths for delaying an input signal, and is configured to generate the driving signal to adjust a slew rate of the output signal by selecting one delay path from the plurality of delay paths in response to the input signal and control signals. A delay time corresponding to each delay path of the plurality of delay paths may be different from a delay time corresponding to the other delay paths of the plurality of delay paths, and each delay path of the plurality of delay paths corresponds to a respective logic value of the control signals.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
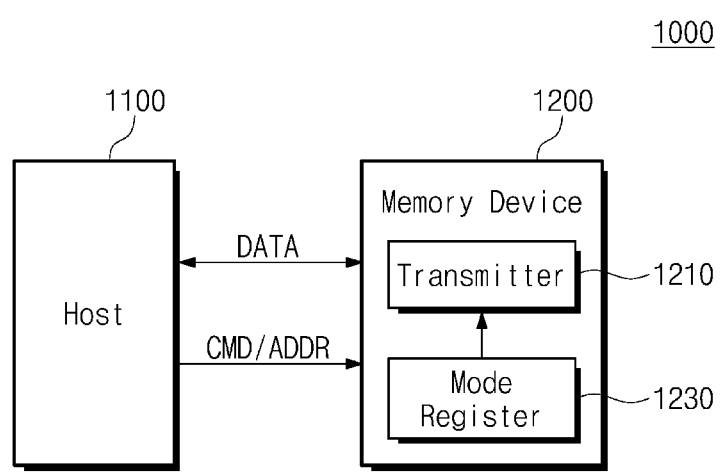
FIG. 1 is a block diagram illustrating a memory system, according to an embodiment of the inventive concept.

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

FIG. 1 is a block diagram illustrating a memory system, according to an embodiment of the inventive concept. Referring to FIG. 1, a memory system 1000 may include a host 1100 and a memory device 1200. For example, the memory system 1000 may be a single system that includes both the host 1100 and the memory device 1200. Alternatively, the host 1100 and the memory device 1200 of the memory system 1000 may be implemented with separate devices, respectively.

The host 1100 may be a processor circuit or system that includes a general-purpose processor or an application processor. Alternatively, the host 1100 may be the following computing device including one or more processors: a personal computer, a peripheral device, a digital camera, personal digital assistant (PDA), a portable media player (PMP), a smartphone, a tablet computer, or a wearable device. The host 1100 may be a memory controller.

The memory device 1200 may store data provided from the host 1100 or data to be provided to the host 1100. The memory device 1200 may be implemented with any storage medium including a volatile memory or a nonvolatile memory. For example, in the case where the memory device 1200 includes a volatile memory, the memory device 1200 may include a DRAM, a static RAM (SRAM), a thyristor RAM (TRAM), a zero capacitor RAM (Z-RAM), a twin transistor RAM (TTRAM), etc. Embodiments may be also applied to all storage mediums each including a volatile memory. For example, the memory device 1200 may include an unbuffered dual in-line memory module (UDIMM), a registered DIMM (RDIMM), a load reduced DIMM (LRDIMM), Non Volatile DIMM (NVDIMM), etc.

For example, in the case where the memory device 1200 includes a nonvolatile memory, the memory device 1200 may be an electrically erasable programmable read-only memory (EEPROM), a flash memory, a magnetoresistive RAM (MRAM), a spin-transfer torque MRAM (STT-MRAM), a conductive bridging RAM (CBRAM), a ferro-electric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of the nonvolatile memory. The above-described examples do not limit embodiments.

Below, for ease of description, it is assumed that the memory device 1200 includes a single memory device. However, as described above, it may be easily understood that the embodiments are applied to various storage devices.

The memory device 1200 may communicate with the host 1100. For example, the memory device 1200 may communicate with the host 1100 based on one or more of various wired communication protocols, such as a universal serial bus (USB), a small computer system interface (SCSI), PCIe, a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). The above-described examples do not limit embodiments.

The memory device 1200 may perform a write operation and a read operation in response to a command/address CMD/ADDR from the host 1100. The write operation and the read operation of the memory device 1200 are as follows.

In the case of the write operation, first, the host 1100 provides an active command and a row address to the memory device 1200. After a reference time, the host 1100 provides an activated write enable command and a column address to the memory device 1200. Afterwards, the host 1100 provides the memory device 1200 with data to be written. The memory device 1200 writes the received data in a memory area (e.g., a memory cell of a memory cell array) that is defined by the column and row addresses.

In the case of the read operation, the host 1100 provides an active command and a row address to the memory device 1200. After a reference time, the host 1100 provides an inactivated write enable command and a column address to the memory device 1200. The memory device 1200 provides requested data from the memory cell array to the host 1100 after a specific time. Below, a data signal that is to be provided from the memory device 1200 to the host 1100 is referred to as an "output data signal," "output signal," or "output data." Hereinafter, "data" may be referred to based on a "signal that includes the data or represents."

According to an embodiment of the inventive concept, the memory system 1000 may calibrate (or, adjust) a slew rate of data output by the memory device 1200, thus making a valid data window of the data wide. The valid data window is a window of a rectangular form in which a range that the host 1100 recognizes output data of the memory device 1200 is expressed by a voltage axis and a time axis. For example, the range that the host 1100 recognizes the output data becomes larger as the valid data window becomes larger. Accordingly, the valid data window determines the quality of output data. Below, the magnitude of the voltage axis of the valid data window is referred to as a "valid voltage magnitude", and the magnitude of the time axis of the valid data window is referred to as a valid time magnitude (or a time of data valid) tDV.

In general, the host 1100 determines a logical level of the output data signal based on a reference voltage Vref. For example, an intermediate value of a maximum voltage level and a minimum voltage level of the output data signal may be set as the reference voltage Vref. Ideally, in the case where the intermediate value of the above-described voltage levels is set as the reference voltage Vref, the valid voltage magnitude may be maximum when the output data signal is uniformly formed in a direction of the voltage axis with respect to the reference voltage Vref.

The valid time magnitude may be affected by a common voltage level of the output data signal. Here, the common voltage level means a crossing point at which a rising edge and a falling edge of the output data signal cross. The common voltage level is affected by symmetry of the voltage axis direction of the output data signal with respect to the reference voltage Vref, symmetry of slew rates of the rising edge and the falling edge of the output data signal, etc. Here, the slew rate is defined as the increasing change of signal per unit of time. Ideally, when the common voltage level is the same as a level of the reference voltage Vref, the valid time magnitude is maximum.

An output resistance value of a main driver (not illustrated), which the memory system 1000 desires, and a resistance value of an on-die termination circuit of the host 1100 may change with a configuration of the memory system 1000. Accordingly, to support various configurations of the memory system 1000, the memory device 1200 may be designed to provide various output resistance values. The slew rate of the output data signal may change with an output resistance value of the main driver of the memory device 1200 and a resistance value of the on-die termination circuit (not illustrated) of the host 1100. According to an embodiment of the inventive concept, the memory system 1000 may calibrate the slew rate of the output data signal such that the common voltage level is matched with a level of the reference voltage Vref based on the above-described output resistance value and the resistance value of the on-die termination circuit of the host 1100, thus increasing the valid voltage magnitude and the valid time magnitude.

The host 1100 may measure the slew rate of the output data signal output from the memory device 1200 according to the output resistance value of the main driver of the memory device 1200 and the resistance value of the on-die termination circuit of the host 1100. The host 1100 may find a combination of slew rates such that the common voltage level of the output data signal is matched with a level of the reference voltage Vref of the host 1100 by changing the slew rate of the output data signal. Next, the host 1100 may again find the above-described slew rate combination based on the resistance value of the on-die termination circuit of the host 1100 by changing the output resistance value of the main driver of the memory device 1200. The host 1100 stores information of the slew rate combination, which is found according to the output resistance value and the resistance value of the on-die termination circuit of the host 1100, in a mode register 1230 included in the memory device 1200.

The memory device 1200 may include a transmitter 1210 and the mode register 1230. The transmitter 1210 calibrates the slew rate of the output data signal of the memory device 1200 based on the information of the slew rate combination stored in the mode register 1230. The mode register 1230 stores the information of the slew rate combination provided from the host 1100. As an example, the mode register 1230 may store a plurality of slew rate combinations and the host 1100 may select one of the slew rate combinations based on an output resistance value of the main driver of the memory device 1200 and a resistance value of the on-die termination circuit of the host 1100. According to the above description, the common voltage level of the output data signal may be matched with a level of the reference voltage Vref of the host 1100, and the valid data window of the output data signal may increase.

Figure 2A:
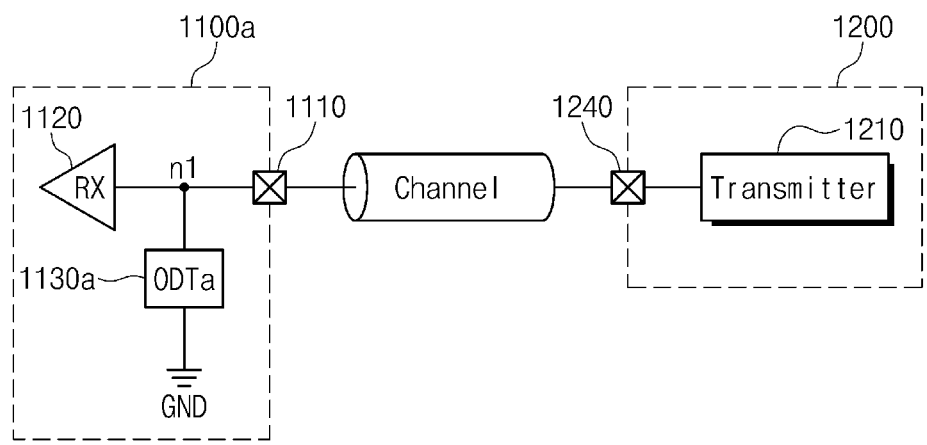
FIGS. 2A to 2C are block diagrams illustrating embodiments of an on-die termination circuit of a host illustrated in FIG. 1 according to example embodiments.
Figure 2B:
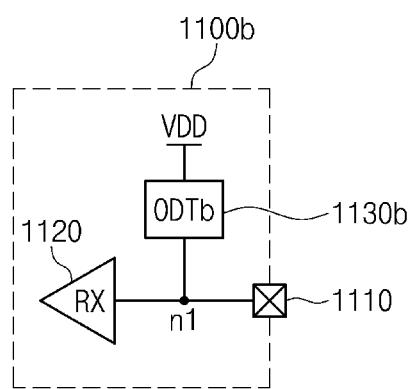
Figure 2C:
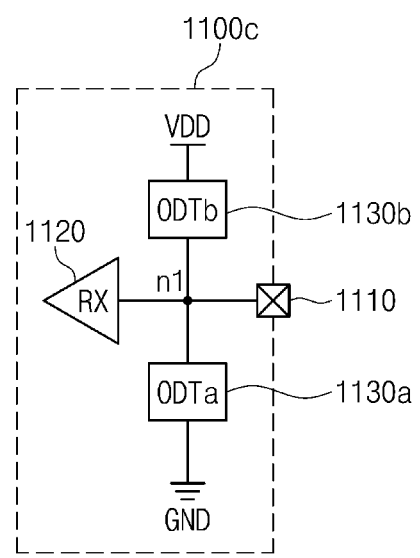

FIGS. 2A to 2C are block diagrams illustrating embodiments of an on-die termination circuit of a host illustrated in FIG. 1 according to example embodiments. FIGS. 2A to 2C will be described with reference to FIG. 1. Referring to FIGS. 2A to 2C, each of hosts 1100a, 1100b, and 1100c may include a host data pad 1110, a receiver 1120, and at least one of a-type and b-type on-die termination circuits 1130a and 1130b.

The host data pad 1110 is provided with a data signal from the transmitter 1210 of the memory device 1200 through a memory data pad 1240 and a channel. The host data pad 1110 is connected with the receiver 1120 and the a-type on-die termination circuit 1130a through a node n1 of the host 1100a or is connected with the receiver 1120 and the b-type on-die termination circuit 1130b through the node n1 of the host 1100b. The receiver 1120 receives the data signal from the memory device 1200 through the host data pad 1110 and transfers the received data signal to an internal circuit (not illustrated).

In general, a termination resistor may be connected to an end of a transmission line to prevent reflectance of a signal and to improve a characteristic of a signal. Each of the on-die termination circuits 1130a and 1130b is a termination resistor that is integrated in the host 1100 as the above-described termination resistor. Each of the on-die termination circuits 1130a and 1130b is connected with the host data pad 1110 and the receiver 1120 through the node n1. Each of the on-die termination circuits 1130a and 1130b improves a characteristic of a data signal through impedance matching with the transmission line when the host 1100 exchanges data with the memory device 1200. Each of the hosts 1100a, 1100b, and 1100c may include various types of termination circuits based on a termination scheme. As an example, each of the on-die termination circuits 1130a and 1130b may include a termination resistor having a plurality of resistance values.

Referring to FIG. 2A, the host 1100a may include an on-die termination circuit having a structure corresponding to a ground termination scheme. The host 1100a may include the a-type on-die termination circuit 1130a that is connected between the node n1 and a ground voltage GND. For example, the a-type on-die termination circuit 1130a may include a switch and a termination resistor that are connected between the node n1 and the ground voltage GND.

Referring to FIG. 2B, the host 1100b may include an on-die termination circuit having a structure corresponding to a pseudo open-drain (POD) termination scheme. The host 1100b may include the b-type on-die termination circuit 1130b that is connected between a host driving voltage VDD and the node n1. For example, the b-type on-die termination circuit 1130b may include a switch and a termination resistor that are connected between the host driving voltage VDD and the node n1.

For example, the a-type on-die termination circuit 1130a may be implemented such that a plurality of switches and a plurality of termination resistors are connected in parallel between the node n1 and the ground voltage GND. Also, the b-type on-die termination circuit 1130b may be implemented such that a plurality of switches and a plurality of termination resistors are connected in parallel between the host driving voltage VDD and the node n1. As such, an equivalent resistance value of each of the a-type and b-type on-die termination circuits 1130a and 1130b may be changed under control of the corresponding one of the host 1100a, 1100b, and 1100c.

Referring to FIG. 2C, the host 1100c may include an on-die termination circuit having a structure corresponding to a center tap termination (CTT) scheme. The host 1100c may include the a-type on-die termination circuit 1130a that is connected between the node n1 and the ground voltage GND and the b-type on-die termination circuit 1130b that is connected between the host driving voltage VDD and the node n1.

The host 1100 of FIG. 1 may receive a data signal of various voltage levels that are determined according to the structures of the on-die termination circuit described with reference to FIGS. 2A to 2C and a structure of the transmitter 1210. Below, it is assumed that the host 1100 of FIG. 1 includes an on-die termination circuit of the ground termination form described with reference to FIG. 2A.

Figure 3:
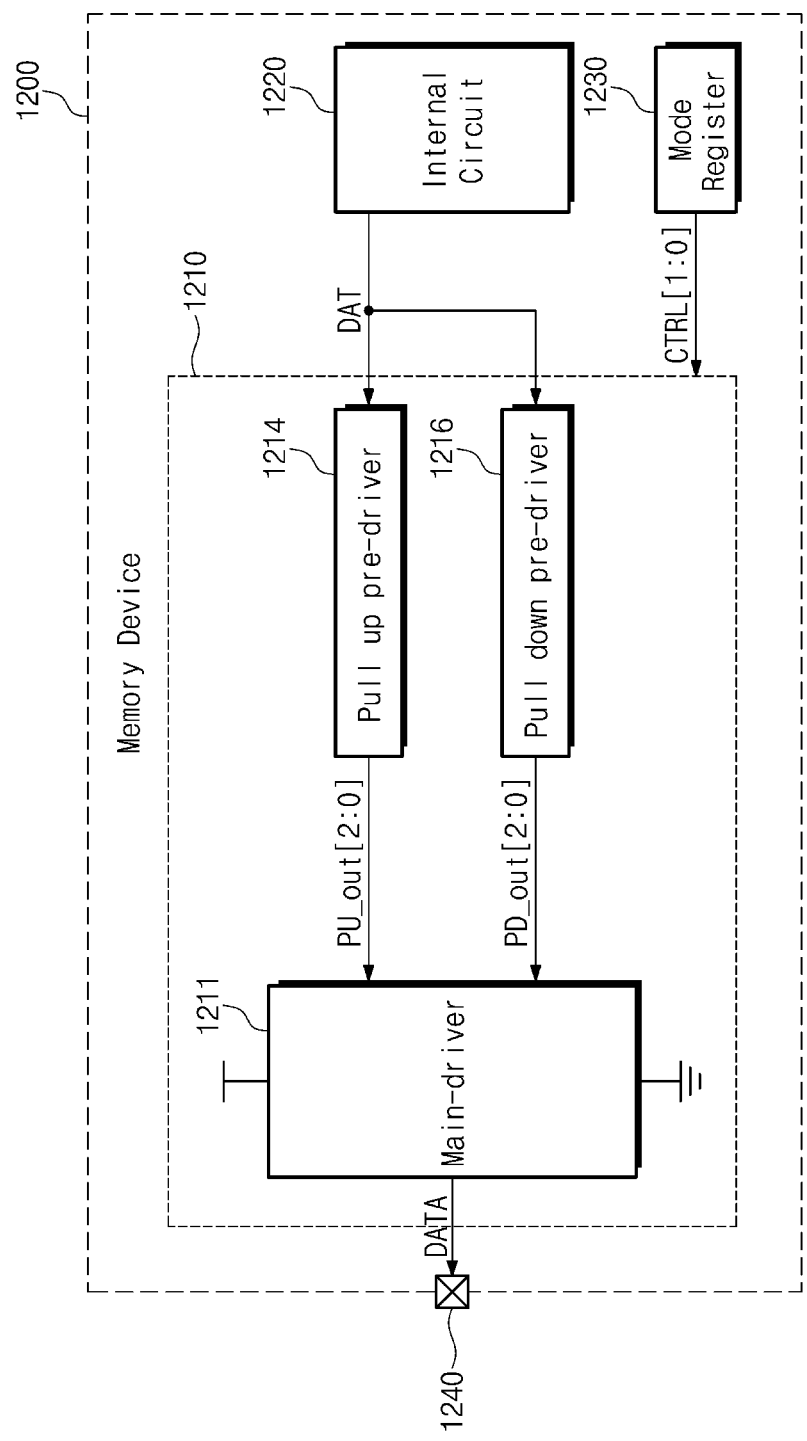
FIG. 3 is a block diagram illustrating a memory device illustrated in FIG. 1 according to example embodiments.

FIG. 3 is a block diagram illustrating a memory device illustrated in FIG. 1. FIG. 3 will be described with reference to FIG. 1 according to example embodiments. Referring to FIG. 3, the memory device 1200 may include the transmitter 1210, an internal circuit 1220, and the mode register 1230.

The transmitter 1210 may include a main driver 1211, a pull up pre-driver 1214, and a pull down pre-driver 1216.

The transmitter 1210 transmits data (or, signals), which are provided from the internal circuit 1220, to the host 1100 through the memory data pad 1240. As an example, the data that are provided from the internal circuit 1220 may be input data (or, input signals) DAT. In this case, the input signal DAT may be input to the pull up pre-driver 1214 and the pull down pre-driver 1216 in common. As another example, the data that are provided from the internal circuit 1220 may include a pull up data DAT_pu and a pull down data DAT pd. In this case, the pull up data DAT_pu and the pull down data DAT pd may be input to the pull up pre-driver 1214 and the pull down pre-driver 1216, respectively.

As an example, the internal circuit 1220 may include a memory cell array (not shown). The memory cell array may include a plurality of memory cells such as DRAM cells, SRAM cells, MRAM cells, PRAM cells, RRAM cells, flash memory cells, etc.

The main driver 1211 generates the output data signal based on a pull up driving signal PU_out[2:0] from the pull up pre-driver 1214 and a pull down driving signal PD_out[2:0] from the pull down pre-driver 1216. The generated output data signal is transferred to the memory data pad 1240. A configuration of the main driver 1211 will be described with reference to FIGS. 4 and 5.

The main driver 1211 is connected with an external channel when transferring data to the outside. Accordingly, to prevent a reflected wave from the channel, which is generated upon transmitting data, the main driver 1211 may perform an operation for impedance matching with the channel. As an example, the memory device 1200 may further include a ZQ calibration circuit (not illustrated) for calibrating an output impedance of the main driver 1211. Also, if necessary, in the case where the memory device 1200 receives data from the host 1100, the main driver 1211 may operate as an on-die termination circuit.

The pull up pre-driver 1214 is provided with the input signal DAT from the internal circuit 1220. The pull up pre-driver 1214 generates the pull up driving signal PU_out[2:0] for driving the main driver 1211 based on the input signal DAT and provides the pull up driving signal PU_out[2:0] to the main driver 1211. The pull down pre-driver 1216 is provided with the input signal DAT from the internal circuit 1220. The pull down pre-driver 1216 generates the pull down driving signal PD_out[2:0] for driving the main driver 1211 based on the input signal DAT and provides the pull down driving signal PD_out[2:0] to the main driver 1211.

At least one of the pull up pre-driver 1214 and the pull down pre-driver 1216 may include a slew control circuit (not illustrated). The slew control circuit may be controlled by a control signal CTRL[1:0] that is provided from the mode register 1230. As an example, in the case where each of the pull up pre-driver 1214 and the pull down pre-driver 1216 includes the slew control circuit, a control signal may be implemented with a multi-bit signal (e.g., 2-bit, 3-bit, etc.) to control each of slew control circuits included pull up pre-driver 1214 and the pull down pre-driver 1216 independently. Below, for ease of description, it is assumed that one of the pull up pre-driver 1214 and the pull down pre-driver 1216 includes slew control circuit. Configurations of the pull up pre-driver 1214 and the pull down pre-driver 1216 will be described with reference to FIGS. 5 and 7.

On the basis of a configuration of the main driver 1211, the pull up driving signal PU_out[2:0] and the pull down driving signal PD_out[2:0] may be implemented with driving signals for providing the same data or may be implemented with driving signals for providing inverse data.

The mode register 1230 stores information of a slew rate combination of the output data signal generated by the host 1100. The mode register 1230 is provided, from the host 1100, with at least one of a structure and a resistance value of the on-die termination circuit (not illustrated) of the host 1100 and is provided, from the memory device 1200, with at least one of a structure and an output resistance value of the main driver 1211 of the memory device 1200. The mode register 1230 detects information of a slew rate combination, which is matched with information of the provided structure and resistance value. The mode register 1230 provides the transmitter 1210 with the control signal CTRL[1:0] for implementing a slew rate based on the detected information of the slew rate combination. Accordingly, the transmitter 1210 calibrates the slew rate of the output data signal based on the information of the slew rate combination stored in the mode register 1230.

In example embodiments, as an example, when the host 1110 has the a-type on-die termination circuit 1130a, the control signal CTRL[1:0] may be "00," "01," and "11." As another example, when the host 1110 has the b-type on-die termination circuit 1130b, the control signal CTRL[1:0] may be "00," "10," and "11."

In example embodiments, as an example, the mode register 1230 may output the control signal CTRL[2:0]. When the host 1110 has the a-type on-die termination circuit 1130a and a resistance value of the on-die termination circuit 1130a is pΩ, the control signal CTRL[2:0] may include "000," "001," "011," and "111." As another example, when the host 1110 has the a-type on-die termination circuit 1130a and a resistance value of the on-die termination circuit 1130a is qΩ lager than pΩ, the control signal CTRL[2:0] may include "000," "101," "010," and "110."

Figure 4A:
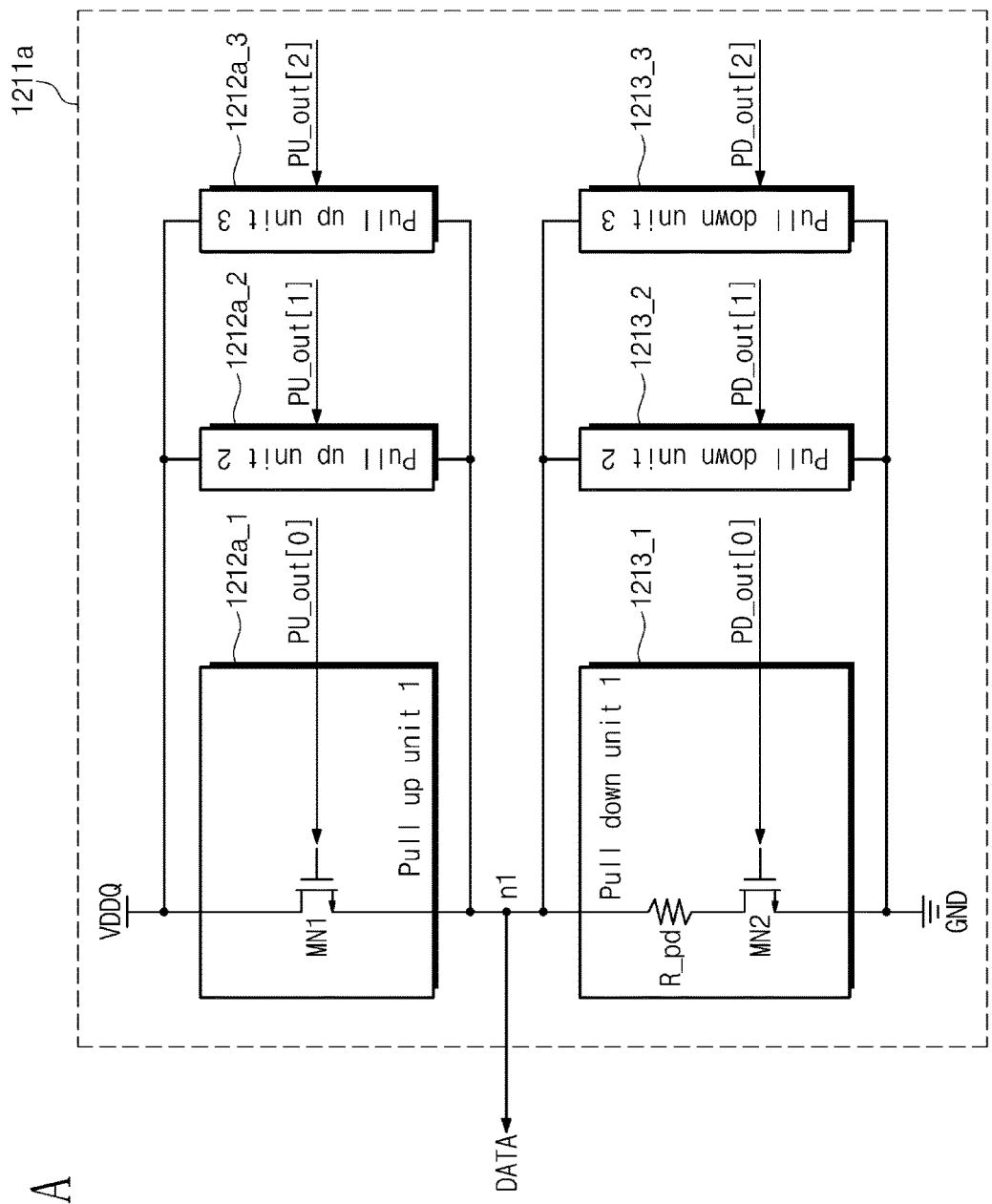
FIGS. 4A and 4B are circuit diagrams illustrating example embodiments of a main driver illustrated in FIG. 3.
Figure 4B:
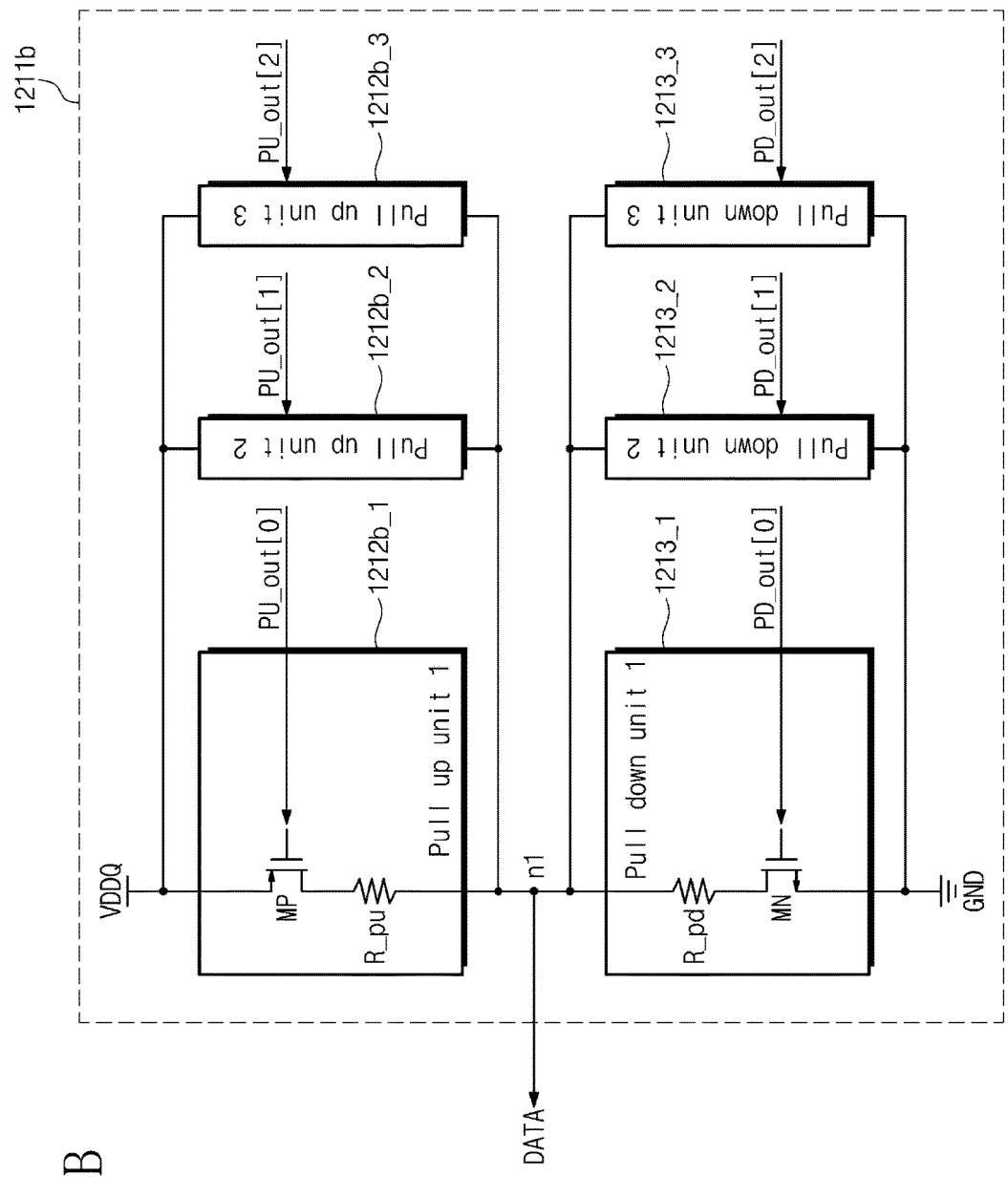

FIGS. 4A and 4B are circuit diagrams illustrating example embodiments of a main driver illustrated in FIG. 3. The circuit diagrams of FIGS. 4A and 4B will be described with reference to FIGS. 1 and 3.

Referring to FIG. 4A, a main driver 1211a may include a structure for implementing an interface of a low voltage swing terminated logic (LVSTL) scheme. The main driver 1211a may include first to third a-type pull up units 1212a_1 to 1212a_3 and first to third pull down units 1213_1 to 1313_3.

The first, second, and third a-type pull up units 1212a_1, 1212a_2, and 1212a_3 are respectively driven by pull up driving signals PU_out[0], PU_out[1], and PU_out[2] and are connected in parallel between an interface driving voltage VDDQ and a node n1. The first, second, and third a-type pull up units 1212a_1, 1212a_2, and 1212a_3 may include the same configuration. Below, the first a-type pull up unit 1212a_1 will be described as an example.

The first a-type pull up unit 1212a_1 may include a first NMOS transistor MN1. The first NMOS transistor MN1 is connected between the interface driving voltage VDDQ and the node n1. The first NMOS transistor MN1 may be turned on or off by the pull up driving signal PU_out[0]. In an example of FIG. 4, for ease of description, it is assumed that the first a-type pull up unit 1212a_1 includes one NMOS transistor.

For example, the first a-type pull up unit 1212a_1 may include a plurality of NMOS transistors that are connected in parallel. In this case, the pull up driving signal PU_out[0] may include bits, the number of which corresponds to the number of NMOS transistors included in the first a-type pull up unit 1212a_1. The NMOS transistors of the first a-type pull up unit 1212a_1 may be turned on or off by the corresponding bit values of the pull up driving signal PU_out[0].

The first, second, and third pull down driving units 1213_1, 1213_2, and 1213_3 are respectively driven by pull down driving signals PD_out[0], PD_out[1], and PD_out[2] and are connected in parallel between the node n1 and the ground voltage GND. The first, second, and third pull down units 1213_1, 1213_2, and 1213_3 may include the same configuration. Below, the first pull down unit 1213_1 will be described as an example.

The first pull down unit 1213_1 may include a pull down resistor R_pd and a second NMOS transistor MN2. The pull down resistor R_pd and the second NMOS transistor MN2 are connected in series between the node n1 and the ground voltage GND. As an example, a resistance value of the pull down resistor R_pd may be higher than a turn-on resistance value of the second NMOS transistor MN2. The second NMOS transistor MN2 may be turned on or off by the pull down driving signal PD_out[0]. In an example of FIG. 4, for ease of description, it is assumed that the first pull down unit 1213_1 includes one NMOS transistor.

For example, the first pull down unit 1213_1 may include a plurality of NMOS transistors that are connected in parallel. In this case, the pull down driving signal PD_out[0] may include bits, the number of which corresponds to the number of NMOS transistors included in the first pull down unit 1213_1. The NMOS transistors of the first pull down unit 1213_1 may be turned on or off by the corresponding bit values of the pull down driving signal PD_out[0].

The memory device 1200 that includes the main driver 1211_a of a structure for implementing an interface of an LVSTL scheme may operate together with the host 1100 that includes the on-die termination circuit 1130a of the ground termination form. In this case, a voltage of logic "1" of the output data is generated by dividing the host driving voltage VDD by resistance values of the first to third a-type pull up units 1212a_1 to 1212a_3 and the on-die termination circuit 1130a of the host 1100. Accordingly, a slew rate of a rising edge of the output data is determined by a resistance division ratio.

Also, a voltage of logic "0" of the output data is generated when the first to third pull down units 1213_1 to 1213_3 and the on-die termination circuit 1130a of the host 1100 are electrically connected with the ground voltage GND. Accordingly, a slew rate of a falling edge of the output data is determined by an RC delay that is determined based on an output resistance value of the first to third pull down units 1213_1 to 1213_3, a resistance value of the on-die termination circuit 1130a, and capacitance of a parasitic capacitor. With above description, the slew rates of rising and falling edges of the output data are determined by different elements and schemes.

Accordingly, in the case where the output resistance value of the memory device 1200 and the resistance value of the on-die termination circuit of the host 1100 are changed, slew-rate variations of the rising and falling edges of the output data may be different from each other due to the changed resistance values. In this case, the slew rates of the rising and falling edges of the output data are asymmetrical, and thus, the common voltage level may be different from a voltage level of the reference voltage Vref of the host 1100. As an example, the voltage level of the reference voltage Vref may be a medium voltage level between a logic high voltage level and a logic low voltage level.

Referring to FIG. 4B, a main driver 1211b may include a structure for implementing an interface of a POD scheme or a serial stub terminated logic (SSTL) scheme. The main driver 1211b may include first to third b-type pull up units 1212b_1 to 1212b_3 and first to third pull down units 1213_1 to 1213_3. Configurations and operations of the first to third pull down units 1213_1 to 1213_3 are the same as configurations and operations of the first to third pull down units 1213_1 to 1213_3 illustrated in FIG. 4A. The main driver 1211b may implement an interface of the POD scheme together with a termination circuit of the POD termination scheme illustrated in FIG. 2B. Also, the main driver 1211b may implement an interface of the LVSTL scheme together with a termination circuit of the CTT termination scheme illustrated in FIG. 2C.

The first, second, and third b-type pull up units 1212b_1, 1212b_2, and 1212b_3 are respectively driven by the pull up driving signals PU_out[0], PU_out[1], and PU_out[2] and are connected in parallel between the interface driving voltage VDDQ and the node n1. The first, second, and third b-type pull up units 1212b_1, 1212b_2, and 1212b_3 may include the same configuration. Below, the first b-type pull up unit 1212b_1 will be described as an example.

The first b-type pull up unit 1212b_1 may include a PMOS transistor MP and a pull up resistor R_pu. The PMOS transistor MP and the pull up resistor R_pu are connected in series between the interface driving voltage VDDQ and the node n1. As an example, a resistance value of the pull up resistor R_pu may be higher than a turn-on resistance value of the PMOS transistor MP. The PMOS transistor MP may be turned on or off by the pull up driving signal PU_out[0]. In an example of FIG. 4B, for ease of description, it is assumed that the first b-type pull up unit 1212b 1 includes one PMOS transistor.

For example, the first b-type pull up unit 1212b_1 may include a plurality of PMOS transistors that are connected in parallel. In this case, the pull up driving signal PU_out[0] may include bits, the number of which corresponds to the number of PMOS transistors included in the first b-type pull up unit 1212b_1. The PMOS transistors of the first b-type pull up unit 1212b_1 may be turned on or off by the corresponding bit values of the pull up driving signal PU_out[0].

Below, it is assumed that the main driver 1211 of FIG. 3 is the main driver 1211a including a structure for implementing an interface of the LVSTL scheme illustrated in FIG. 4. Also, below, it is assumed that the pull up driving signal PU_out[2:0] and the pull down driving signal PD_out[2:0] for driving the main driver 1211a are implemented with driving signals for providing opposite data.

Figure 5:
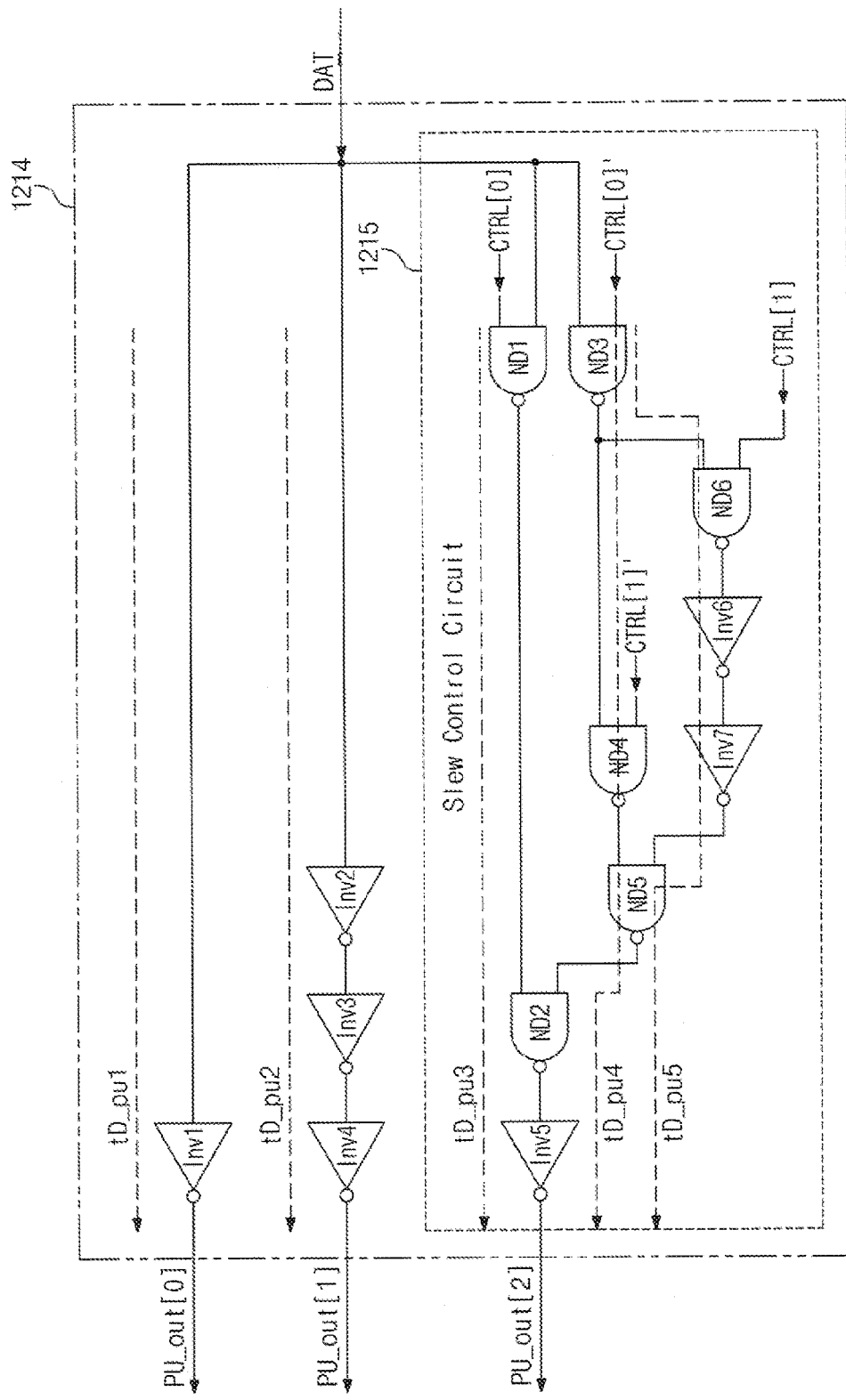
FIG. 5 is a block diagram illustrating a pull up pre-driver illustrated in FIG. 3 according to example embodiments.

FIG. 5 is a block diagram illustrating a pull up pre-driver illustrated in FIG. 3 according to example embodiments. FIG. 5 will be described with reference to FIG. 3. Referring to FIG. 5, the pull up pre-driver 1214 may include a slew control circuit 1215. The pull up pre-driver 1214 may include first, second, third, fourth, fifth, sixth, and seventh inverters Inv1, Inv2, Inv3, Inv4, Inv5, Inv6, and Inv7 and first, second, third, fourth, fifth, and sixth NAND gates ND1, ND2, ND3, ND4, ND5, and ND6.

The pull up pre-driver 1214 is provided with the input signal DAT from the internal circuit 1220. The pull up pre-driver 1214 delays an inverted signal of the input signal DAT by an amount caused by a first pull up delay path tD_pu1 to output the pull up driving signal PU_out[0]. The first inverter Inv1 forms a first delay unit. The first delay unit forms the first pull up delay path tD_pu1.

The pull up pre-driver 1214 delays an inverted signal of the input signal DAT by an amount caused by a second pull up delay path tD_pu2 to output the pull up driving signal PU_out[1]. The second to fourth inverters Inv2 to Inv4 form a second delay unit. The second delay unit forms the second pull up delay path tD_pu2.

The slew control circuit 1215 delays an inverted signal of the input signal DAT by an amount caused by one delay path, which is selected by a control signal CTRL[1:0], from among third to fifth pull up delay paths tD_pu3 to tD_pu5 to output the pull up driving signal PU_out[2]. The control signal CTRL[1:0] includes CTRL[0], CTRL[0]' (inversion of CTRL[0]), CTRL[1], and CTRL[1]' (inversion of CTRL[1]). The first NAND gate ND1, the second NAND gate ND2, and the fifth inverter Inv5 form a third delay unit. The third delay unit forms the third pull up delay path tD_pu3. The third to fifth NAND gates ND3 to ND5, the second NAND gate ND2, and the fifth inverter Inv5 form a fourth delay unit. The fourth delay unit forms the fourth pull up delay path tD_pu4. The third NAND gate ND3, the sixth NAND gate ND6, the sixth and seventh inverters Inv6 and Inv7, the fifth NAND gate ND5, the second NAND gate ND2, and the fifth inverter Inv5 form a fifth delay unit. The fifth delay unit forms the fifth pull up delay path tD_pu5.

In the case where the control signals CTRL[1] and CTRL[0] are "01", the first NAND gate ND1 is activated, and the third NAND gate ND3 is deactivated. In this case, the third delay unit including the first NAND gate ND1 is selected, and the fourth and fifth delay units including the third NAND gate ND3 are deactivated. Thus, the pull up driving signal PU_out[2] is output through the third pull up delay path tD_pu3. In the case where the control signals CTRL[1] and CTRL[0] are "00", the first and sixth NAND gates ND1 and ND6 are deactivated, and the third and fourth NAND gates ND3 and ND4 are activated. In this case, the third delay unit including the first NAND gate ND1 and the fifth delay unit including the sixth NAND gate ND6 are deactivated. As such, the fourth delay unit including the third and fourth NAND gates ND3 and ND4 is selected and activated. Thus, the pull up driving signal PU_out[2] is output through the fourth pull up delay paths tD_pu4. In the case where the control signals CTRL[1] and CTRL[0] are "10", the first and fourth NAND gates ND1 and ND4 are deactivated, and the third and sixth NAND gates ND3 and ND6 are activated. In this case, the fifth delay unit including the third and sixth NAND gates ND3 and ND6 is selected and activated. Thus, the pull up driving signal PU_out[2] is output through the fifth pull up delay path tD_pu5.

Figure 6:
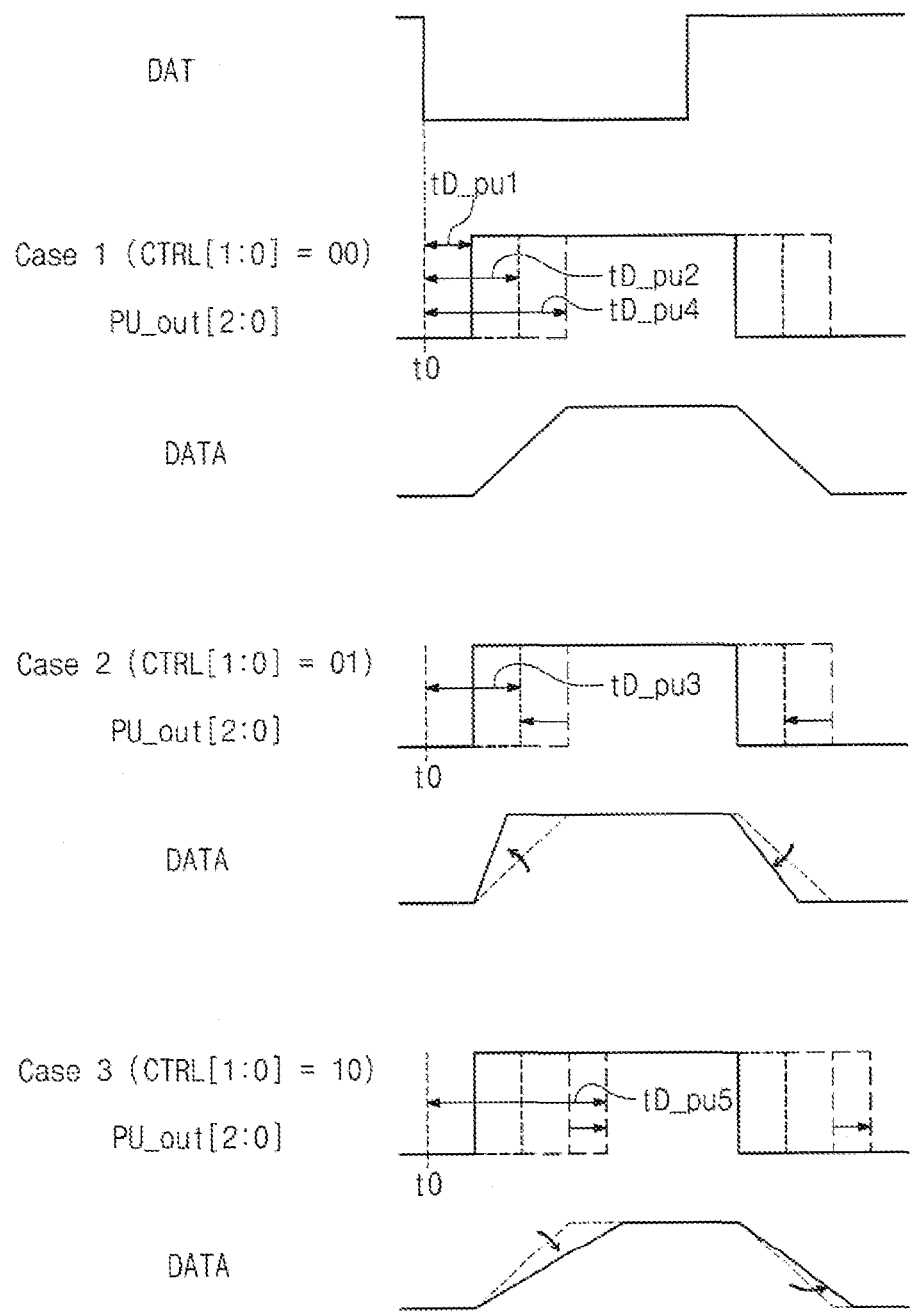
FIG. 6 is a timing diagram illustrating a data signal that is output according to an operation of a pull up pre-driver of FIG. 5 according to example embodiments.

In FIGS. 5 and 6, for ease of description, it is assumed that a delay by one inverter is the same as a delay by one NAND gate. In this case, a delay time of the second pull up delay path tD_pu2 is the same as a delay time of the third pull up delay path tD_pu3. Accordingly, in an example of FIGS. 5 and 6, a delay time of the second pull up delay path tD_pu2 is longer than a delay time of the first pull up delay path tD_pu1, and a delay time of the third pull up delay path tD_pu3 is the same as a delay time of the second pull up delay path tD_pu2. Also, a delay time of the fourth pull up delay path tD_pu4 is longer than a delay time of the third pull up delay path tD_pu3, and a delay time of the fifth pull up delay path tD_pu5 is longer than a delay time of the fourth pull up delay path tD_pu4.

FIG. 6 is a timing diagram illustrating a data signal that is output according to an operation a pull up pre-driver of FIG. 5. The timing diagram of FIG. 6 will be described with reference to FIGS. 1, 3, and 5. Referring to FIG. 6, a slew rate of the output data may vary with an operation of the slew control circuit 1215 included in the pull up pre-driver 1214. At a time point t0, the input signal DAT of logic "0" is provided to the pull up pre-driver 1214. The pull up pre-driver 1214 delays an inverted signal of input signal DAT respectively by the first and second pull up delay paths tD_pu1 and tD_pu2 regardless of the control signal CTRL [1:0] to output the pull up driving signals PU_out[0] and PU_out[1].

In the case where the control signals CTRL[1] and CTRL[0] are "00" (Case 1), the pull up pre-driver 1214 delays an inverted data of input signal DAT by the fourth pull up delay path tD_pu4 of the activated fourth delay unit to output the pull up driving signal PU_out[2]. The main driver 1211 provides the output data having an initial slew rate to the host 1100 in response to the output pull up driving signal PU_out [2:0].

In the case where the control signals CTRL[1] and CTRL[0] are "01" (Case 2), the pull up pre-driver 1214 delays an inverted signal of the input signal DAT by the third pull up delay path tD_pu3 of the activated third delay unit to output the pull up driving signal PU_out[2]. The pull up driving signal PU_out[2] is provided to the main driver 1211 prior to the pull up driving signal PU_out[2] of the first case "Case 1". Accordingly, since a time at which the pull up driving signals PU_out[0] to PU_out[2] are provided to the main driver 1211 is shorter than that of the first case "Case 1", the main driver 1211 provides the host 1100 with the output data having a slew rate higher than the initial slew rate.

The main driver 1211 generates a voltage corresponding to logic "1" of the output data in response to the output pull up driving signal PU_out [2:0]. Accordingly, even though a time needed to provide the pull up driving signal PU_out [2:0] to the main driver 1211 affects both a rising edge and a falling edge of the output data, a change in a time needed to provide the pull up driving signal PU_out[2:0] to the main driver 1211 may have more influence on a slew rate of the rising edge than on a slew rate of the falling edge of the output data. Accordingly, in the second case "Case 2", compared with the initial slew rate, an increment of the slew rate of the rising edge of the output data may be larger than an increment of the slew rate of the falling edge of the output data.

In the case where the control signals CTRL[1] and CTRL[0] are "10" (Case 3), the pull up pre-driver 1214 delays an inverted signal of input signal DAT by the fifth pull up delay tD_pu5 of the activated fifth delay unit to output the pull up driving signal PU_out[2]. The pull up driving signal PU_out[2] is provided to the main driver 1211 after the pull up driving signal PU_out[2] of the first case "Case 1". Accordingly, since a time at which the pull up driving signals PU_out[0] to PU_out[2] are sequentially provided to the main driver 1211 is longer than that of the first case "Case 1", the main driver 1211 provides the host 1100 with the output data having a slew rate lower than the initial slew rate. Also, for the above-described reason, in the third case "Case 3", compared with the initial slew rate, a decrement of the slew rate of the rising edge of the output data may be larger than a decrement of the slew rate of the falling edge of the output data.

Figure 7:
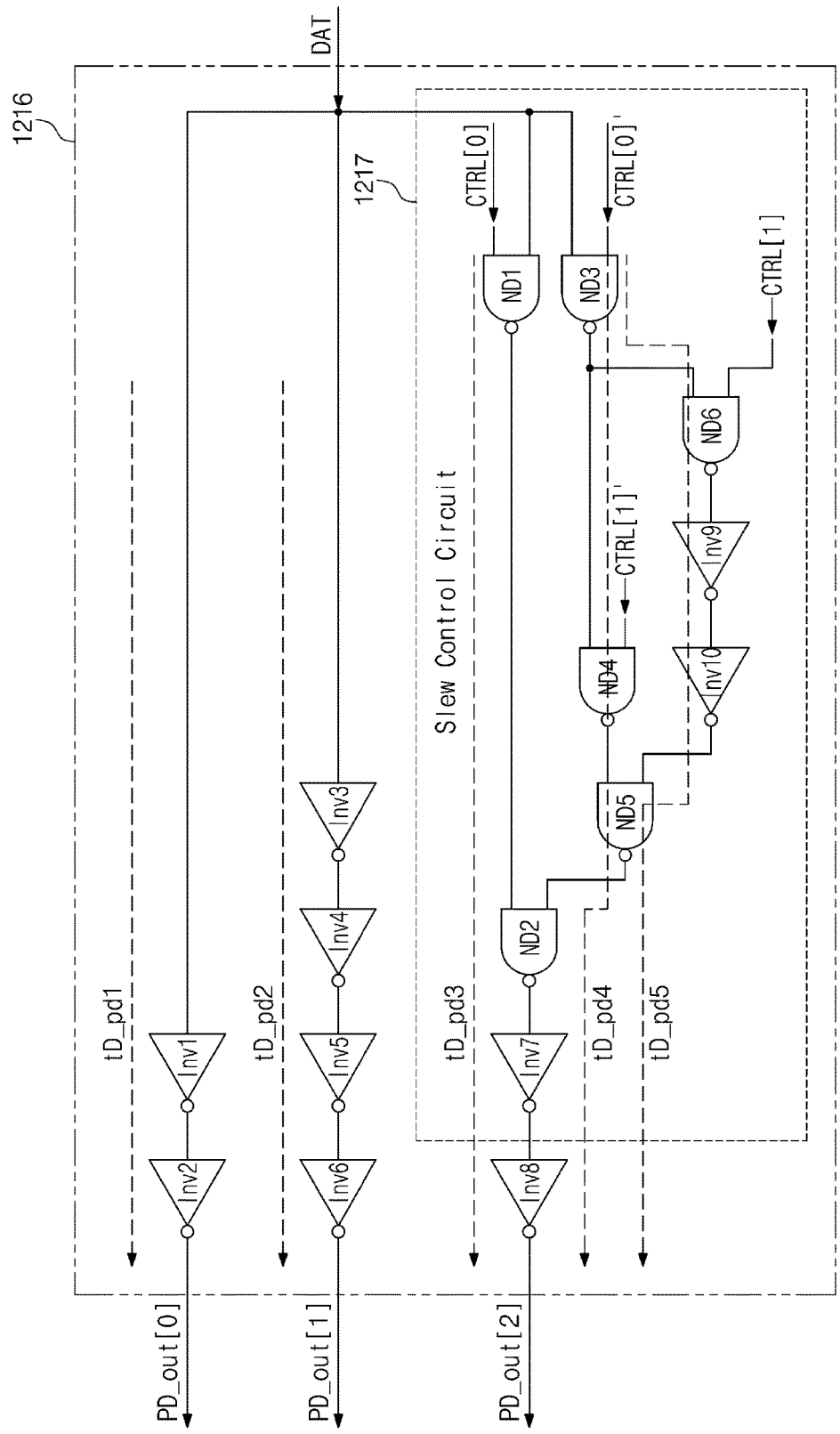
FIG. 7 is a block diagram illustrating a pull down pre-driver illustrated in FIG. 3 according to example embodiments.

FIG. 7 is a block diagram illustrating a pull down pre-driver illustrated in FIG. 3 according to example embodiments. FIG. 7 will be described with reference to FIG. 3. Referring to FIG. 7, the pull down pre-driver 1216 may include a slew control circuit 1217. The pull down pre-driver 1216 may include first, second, third, fourth, fifth, sixth, seventh, eighth, ninth, and tenth inverters Inv1, Inv2, Inv3, Inv4, Inv5, Inv6, Inv7, Inv8, Inv9, and Inv10 and first, second, third, fourth, fifth, and sixth NAND gates ND1, ND2, ND3, ND4, ND5, and ND6.

The pull down pre-driver 1216 is provided with the input signal DAT from the internal circuit 1220. The pull down pre-driver 1216 delays the input signal DAT using a first pull down delay path tD_pd1 to output the pull down driving signal PD_out[0]. The first and second inverters Inv1 and Inv2 form a first delay unit. The first delay unit forms the first pull down delay path tD_pd1. Also, the pull down pre-driver 1216 delays the input signal DAT using a second pull down delay path tD_pd2 to output the pull down driving signal PD_out[1]. The third to sixth inverters Inv3 to Inv6 form a second delay unit. The second delay unit forms the second pull down delay path tD_pd2.

The slew control circuit 1217 delays the input signal DAT using one delay path, which is selected by the control signal CTRL[1:0], from among third to fifth pull down delay paths tD_pd3 to tD_pd5 to output the pull down driving signal PD_out[2]. The first and second NAND gates ND1 and ND2 and the seventh and eighth inverters Inv7 to Inv8 form a third delay unit. The third delay unit forms the third pull down delay path tD_pd3. The third to fifth NAND gates ND3 to ND5, the second NAND gate ND2, and the seventh and eighth inverters Inv7 and Inv8 form a fourth delay unit. The fourth delay unit forms the fourth pull down delay path tD_pd4. The third NAND gate ND3, the sixth NAND gate ND6, the ninth and tenth inverters Inv9 and Inv10, the fifth NAND gate ND5, the second NAND gate ND2, and the seventh and eighth inverters Inv7 and Inv8 form a fifth delay unit. The fifth delay unit forms the fifth pull down delay path tD_pd5.

An operation of the slew control circuit 1217 is the same as an operation of the slew control circuit 1215 of FIG. 6. For example, in the case where the control signals CTRL[1] and CTRL[0] are "01", the first NAND gate ND1 is activated, and the third, fourth, and sixth NAND gates ND3, ND4, and ND6 are deactivated. In this case, the third delay unit including the first NAND gate ND1 is selected. Thus, the pull down driving signal PD_out[2] is output through the third pull down delay path tD_pd3. In the case where the control signals CTRL[1] and CTRL[0] are "00", the third and fourth NAND gates ND3 and ND4 are activated, and the first and sixth NAND gates ND1 and ND6 are deactivated. In this case, the fourth delay unit including the third and fourth NAND gates ND3 and ND4 is selected. Thus, the pull down driving signal PD_out[2] is output through the fourth pull down delay path tD_pd4. In the case where the control signals CTRL[1] and CTRL[0] are "10", the third and sixth NAND gates ND3 and ND6 are activated, and the first and fourth NAND gates ND1 and ND4 are deactivated. In this case, the fifth delay unit including the third and sixth NAND gates ND3 and ND6 is selected and activated. Thus, the pull down driving signal PD_out[2] is output through the fifth pull down delay path tD_pd5.

Figure 8:
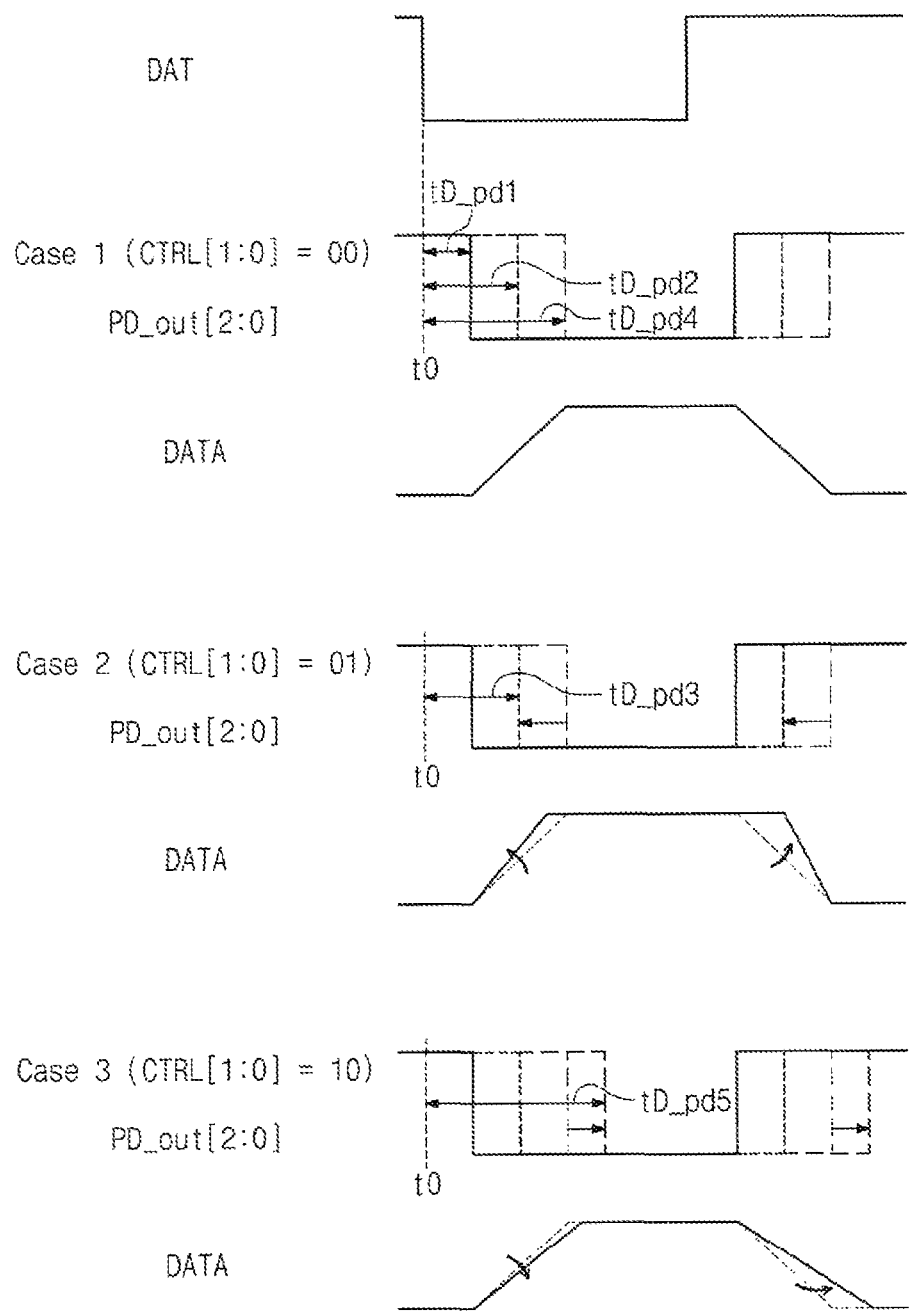
FIG. 8 is a timing diagram illustrating a data signal that is output according to an operation a pull down pre-driver of FIG. 7 according to example embodiments.

In FIGS. 7 and 8, for ease of description, it is assumed that a delay by one inverter is the same as a delay by one NAND gate. In this case, the second pull down delay path tD_pd2 is the same as the third pull down delay path tD_pd3. Accordingly, in an example of FIGS. 6 and 7, the second pull down delay path tD_pd2 is longer than the first pull down delay path tD_pd1, and the third pull down delay path tD_pd3 is the same as the second pull down delay path tD_pd2. Also, the fourth pull down delay path tD_pd4 is longer than the third pull down delay path tD_pd3, and the fifth pull down delay path tD_pd5 is longer than the fourth pull down delay path tD_pd4.

FIG. 8 is a timing diagram illustrating a data signal that is output according to an operation a pull down pre-driver of FIG. 7 according to example embodiments. Referring to FIG. 8, a slew rate of the output data may vary with an operation of the slew control circuit 1217 included in the pull down pre-driver 1216. At a time point t0, the input signal DAT of logic "0" is provided to the pull down pre-driver 1216. The pull down pre-driver 1216 delays the input signal DAT respectively by the first and second pull down delays paths tD_pd1 and tD_pd2 regardless of the control signal CTRL[1:0] to output the pull down driving signals PD_out[0] and PD_out[1].

In the case where the control signals CTRL[1] and CTRL[0] are "00" (Case 1), the pull down pre-driver 1216 delays the input signal DAT by the fourth pull down delay path tD_pd4 of the activated fourth delay unit to output the pull down driving signal PD_out[2]. The main driver 1211 provides the output data having an initial slew rate to the host 1100 in response to the output pull down driving signal PD_out [2:0].

In the case where the control signals CTRL[1] and CTRL[0] are "01" (Case 2), the pull down pre-driver 1216 delays the input signal DAT by the third pull down delay path tD_pd3 of the activated third delay unit to output the pull down driving signal PD_out[2]. The pull down driving signal PD_out[2] is provided to the main driver 1211 prior to the pull down driving signal PU_out[2] of the first case "Case 1". Accordingly, since a time at which the pull down driving signals PD_out[0] to PD_out[2] are provided to the main driver 1211 is shorter than that of the first case "Case 1", the main driver 1211 provides the host 1100 with the output data having a slew rate higher than the initial slew rate.

The main driver 1211 generates a voltage corresponding to logic "0" of the output data in response to the output pull down driving signal PD_out [2:0]. Accordingly, unlike that described above, a change in a time needed to provide the pull down driving signal PD_out[2:0] to the main driver 1211 may have more influence on a slew rate of the falling edge of the output data than on the rising edge of the output data. Accordingly, in the second case "Case 2", compared with the initial slew rate (i.e., Case 1), an increment of the slew rate of the falling edge of the output data may be larger than an increment of the slew rate of the rising edge of the output data.

In the case where the control signals CTRL[1] and CTRL[0] are "10" (Case 3), the pull down pre-driver 1216 delays the input signal DAT by the fifth pull down delay tD_pd5 of the activated fifth delay unit to output the pull down driving signal PD_out[2]. The pull down driving signal PU_out[2] is provided to the main driver 1211 after the pull down driving signal PU_out[2] of the first case "Case 1". Accordingly, since a time at which the pull down driving signals PU_out[0] to PU_out[2] are sequentially provided to the main driver 1211 is longer than that of the first case "Case 1", the main driver 1211 provides the host 1100 with the output data having a slew rate lower than the initial slew rate. Also, for the above-described reason, in the third case "Case 3", compared with the initial slew rate, a decrement of the slew rate of the falling edge of the output data may be larger than a decrement of the slew rate of the rising edge of the output data.

Figure 9:
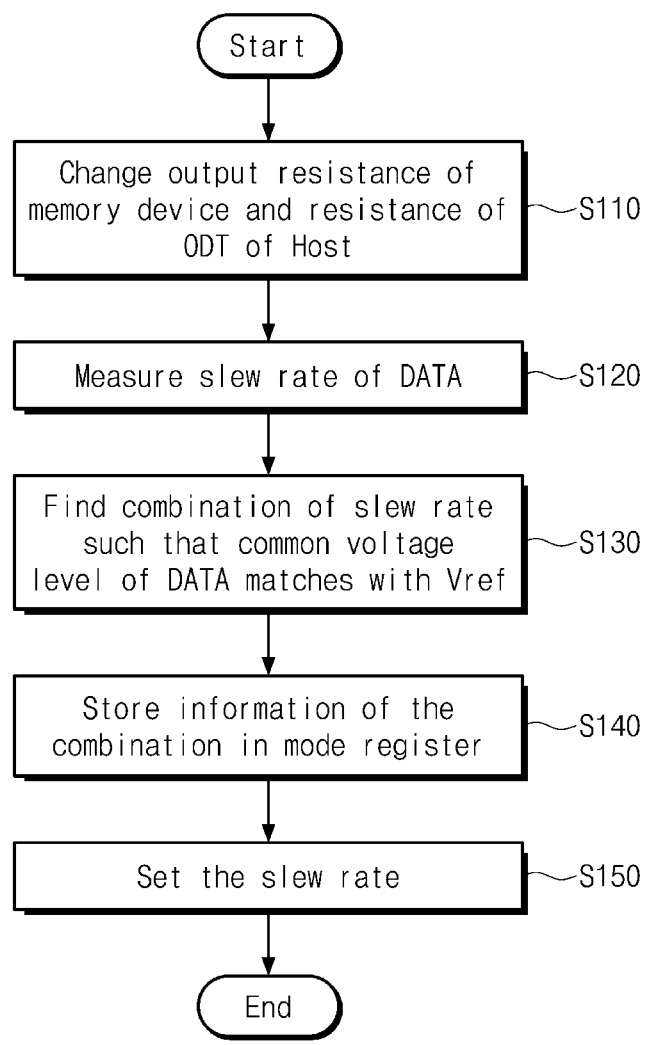
FIG. 9 is a flowchart for describing a method of calibrating a slew rate of a data signal in a memory system of FIG. 1, according to an embodiment of the inventive concept.

FIG. 9 is a flowchart for describing a method of calibrating a slew rate of a data signal in a memory system of FIG. 1, according to an embodiment of the inventive concept. The flowchart of FIG. 9 will be described with reference to FIGS. 1 and 3. Referring to FIG. 9, the memory system 1000 may calibrate the common voltage level of the output data such that the valid data window increases.

In operation S110, the host 1100 changes an output resistance value of the main driver 1211 included in the memory device 1200 and a resistance value of an on-die termination circuit of the host 1100. At a first time, the host 1100 may use initial output resistance value of the main driver 1211 included in the memory device 1200. In operation S120, the host 1100 measures a slew rate of the output data signal. The host 1100 measures slew rates of the rising and falling edges of the output data.

In operation S130, the host 1100 finds a combination of slew rates of the rising edge and the falling edge of the output data to allow the common voltage level of the output data signal to be matched with a level of the reference voltage Vref of the host 1100. As described above, at least one of the pull up pre-driver 1214 and the pull down pre-driver 1216 may include a slew control circuit. The host 1100 may change a slew rate of at least one of the rising edge and the falling edge of the output data by changing the control signal CTRL[1:0] output from the mode register 1230 and measures the common voltage level of the output data signal formed by the changed slew rate.

As described with reference to FIG. 1, to support various memory systems, a single memory device may be designed to provide various output resistance values. Also, the memory system 1000 may provide an on-die termination circuit that implements various resistance values based on an operating environment. As an example, operation S110 to operation S130 may be repeated until finding of a combination of the slew rate such that a common voltage level of the output data signal matches a voltage level of the reference voltage Vref. Operation S110 to operation S130 may be performed on a combination of all output resistance values, which the main driver 1211 of the memory device 1200 provides. In other example embodiments, operation S110 to operation S130 may be performed on a combination of all output resistance values, which the main driver 1211 of the memory device 1200 provides, and all output resistance values, which the on-die termination circuit of the host 1100 provides.

In operation S140, the host 1100 generates information of a slew rate combination based on the measurement result obtained through operation S110 to operation S130, to allow the common voltage level of the output data signal to be matched with a level of the reference voltage Vref of the host 1100 and stores the information of the slew rate combination in the mode register 1230 of the memory device 1200. Operation S110 to operation S140 may be performed through a training process of the memory device 1200. Alternatively, operation S110 to operation S140 may be performed in a test process of the memory device 1200 after the memory device 1200 is completely manufactured.

In operation S150, the memory device 1200 calibrates the slew rate of the output data signal based on the information of the slew rate combination stored in the mode register 1230. In the memory system 1000 in which the memory device 1200 is used, the memory device 1200 may be provided with the output resistance value of the main driver 1211 and the resistance value of the on-die termination circuit of the host 1100, from the host 1100. The mode register 1230 detects information of a slew rate combination, in which the output resistance value and the resistance value of the on-die termination circuit are matched with each other. The mode register 1230 provides the main driver 1211 with the control signal CTRL[1:0] for implementing a slew rate based on the detected slew rate information. With the above description, the main driver 1211 calibrates a slew rate of the output data signal based on the provided control signal CTRL[1:0], and thus, the common voltage level of the output data signal is matched with a level of the reference voltage Vref of the host 1100.

Figure 10:
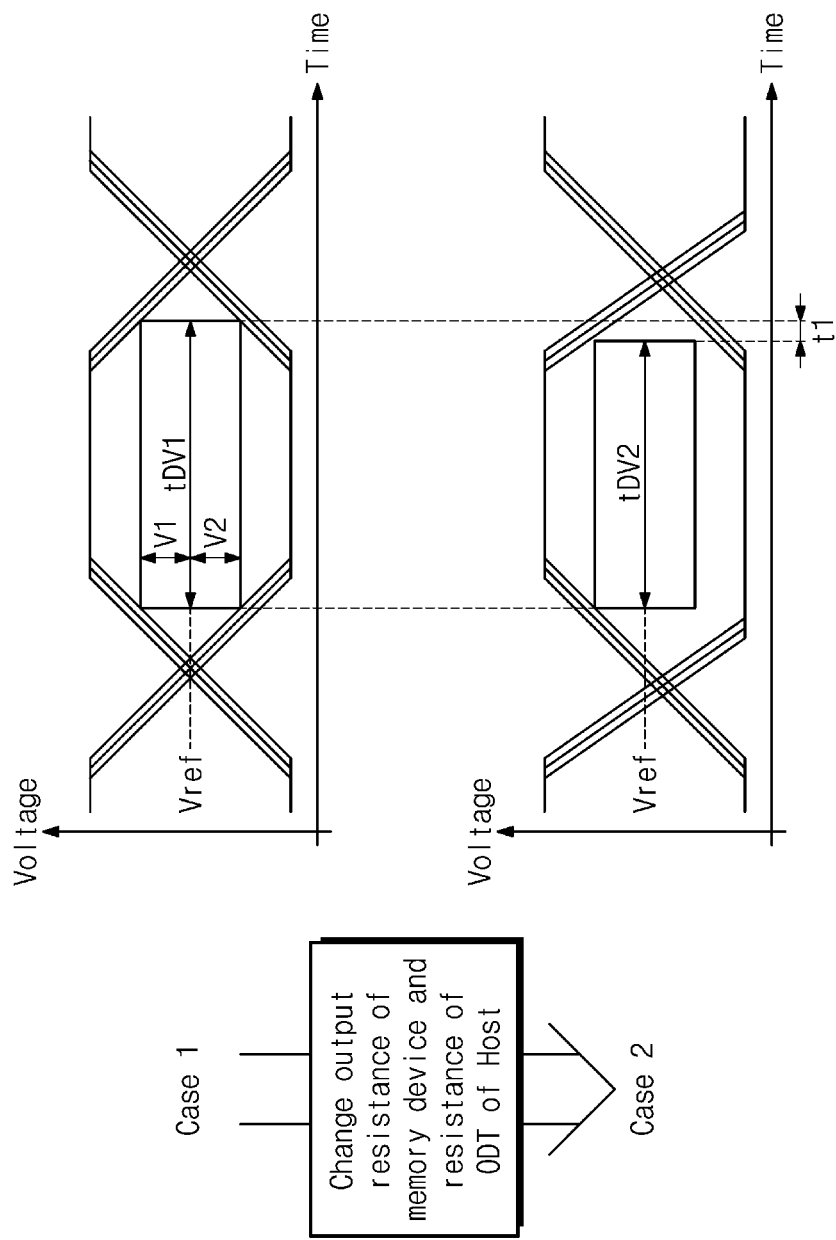
FIG. 10 is a drawing illustrating an output data signal when a memory system illustrated in FIG. 1 operates, according to example embodiments.

FIG. 10 is a drawing illustrating an output data signal when a memory system illustrated in FIG. 1 operates, according to example embodiments. The drawing of FIG. 10 will be described with reference to FIGS. 1 and 3. Referring to FIG. 10, an eye diagram of output data output by the memory device 1200 is illustrated.

As described above, the valid data window is composed of a valid voltage magnitude and a valid time magnitude. The valid voltage magnitude may be defined by a difference (V1+V2) between the maximum voltage (Vref+V1), at which a receiver of the host 1100 recognizes logic "1", and the minimum voltage (Vref−V2), at which the receiver recognizes logic "0". The valid time magnitude is a magnitude of a time at which the receiver recognizes logic "1" or logic "0" when the output data secures a range of voltages. Accordingly, the valid time magnitude may be defined as a time at which there is maintained a voltage section of the output data, in which a voltage of the output data is larger than the maximum voltage (Vref+V1) and is smaller than the minimum voltage (Vref−V2). In FIG. 10, the valid time magnitude is illustrated to be "tDV1".

In a first case "Case 1", the output data has a first valid time magnitude tDV1 with respect to a reference voltage Vref of the host 1100. The first case "Case 1" may be an ideal case, and the common voltage level of the output data is the same as a voltage level of the reference voltage Vref of the host 1100.

In the case where the output resistance value of the memory device 1200 and the resistance value of the on-die termination circuit of the host 1100 are changed (Case 2), a slew rate of the output data may change. An embodiment is illustrated in FIG. 10 as only a slew rate of the falling edge of the output data increases. In this case, by the increased slew rate of the falling edge, a second valid time magnitude tDV2 decreases by a uniform time t1, thus becoming shorter than the first valid time magnitude tDV1.

Figure 11:
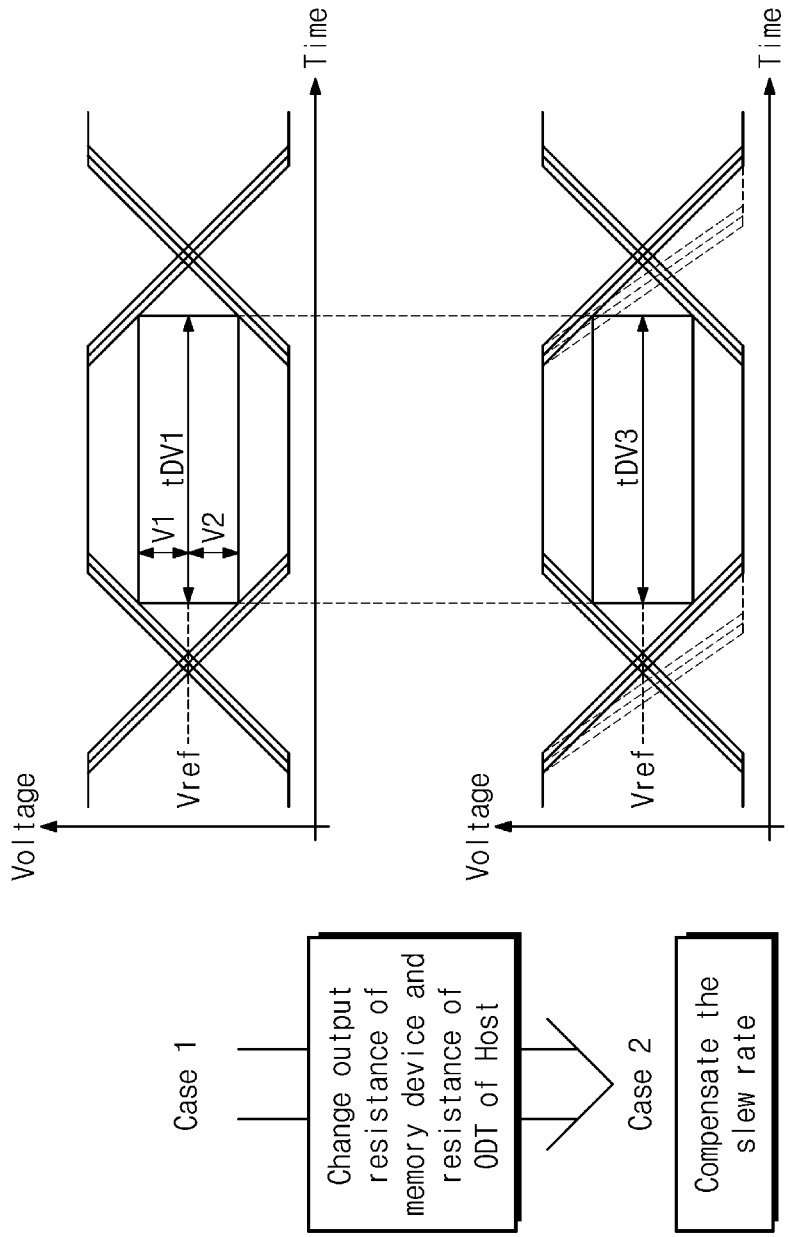
FIG. 11 is a drawing illustrating an output data signal when a memory system of FIG. 1 operates based on a slew rate calibration method of FIG. 9, according to example embodiments.

FIG. 11 is a drawing illustrating an output data signal when a memory system of FIG. 1 operates based on a slew rate calibration method of FIG. 9, according to example embodiments. The drawing of FIG. 11 will be described with reference to FIGS. 1, 3, and 9. Referring to FIG. 11, an eye diagram of output data output by the memory device 1200 is illustrated. In a first case "Case 1", like that illustrated in FIG. 10, the valid data window of the output data has a first valid time magnitude tDV1 along a time axis.

In the case where the output resistance value of the memory device 1200 and the resistance value of the on-die termination circuit of the host 1100 are changed (Case 2), a slew rate of the output data may change. In this case, in the memory system 1000 in which the memory device 1200 is used, the memory device 1200 is provided with the output resistance value of the main driver 1211 and the resistance value of the on-die termination circuit of the host 1100, from the host 1100.

The mode register 1230 detects information of a slew rate combination, in which the output resistance value and the resistance value of the on-die termination circuit are matched with each other, and provides the main driver 1211 with the control signal CTRL[1:0] corresponding to the detected information. The main driver 1211 calibrates a slew rate of the output data signal based on the provided control signal CTRL[1:0]. If the slew rate is calibrated, the common voltage level of the output data is matched with a level of the reference voltage Vref of the host 1100. Accordingly, a third valid time magnitude tDV3 formed by the corrected slew rate may be the same as the first valid time magnitude tDV1.

Figure 12:
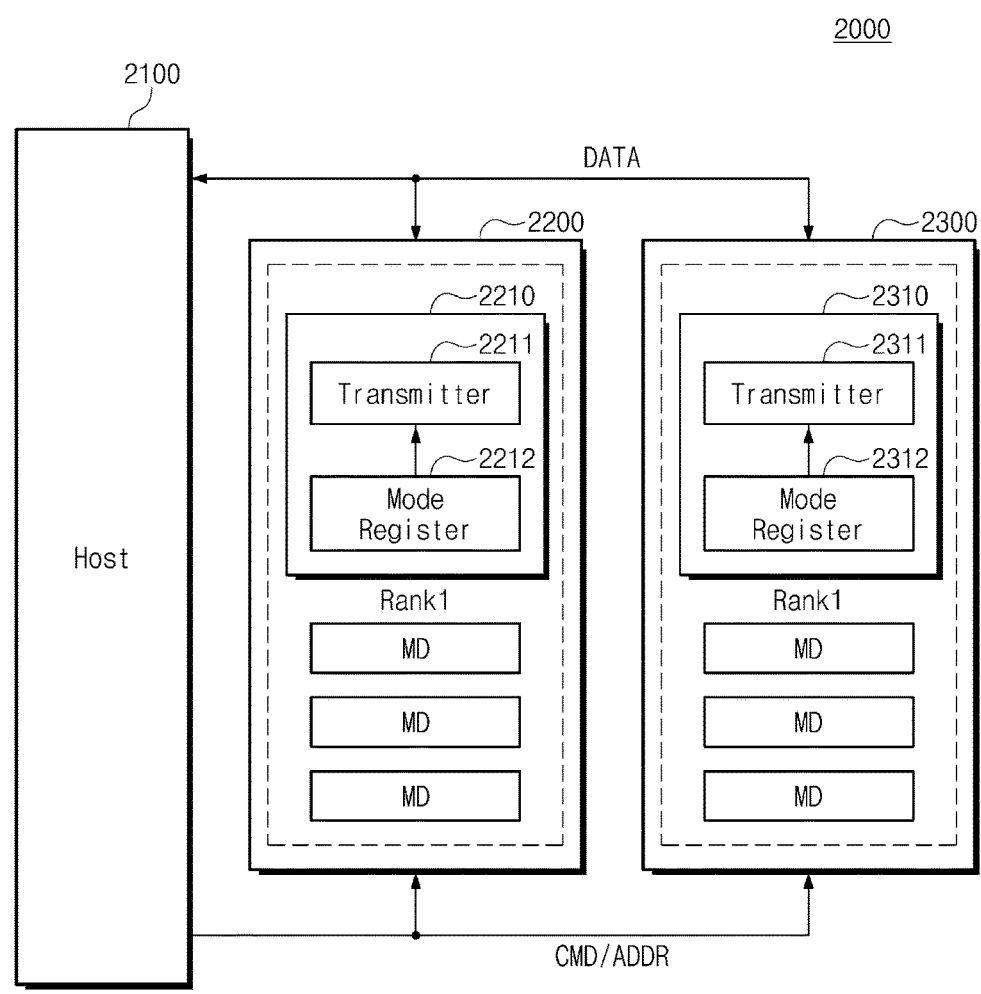
FIG. 12 is a block diagram illustrating a memory system, according to another embodiment of the inventive concept.

FIG. 12 is a block diagram illustrating a memory system, according to another embodiment of the inventive concept. Referring to FIG. 12, a memory system 2000 may include a host 2100, a first dual-inline memory module (DIMM) 2200, and a second DIMM 2300. Compared with the memory system 100 of FIG. 1, the memory system 2000 of FIG. 12 shows a configuration of 2 DPC (DIMM Per Channel) in which two DIMMs are connected to one data channel.

The host 2100 exchanges data with the first and second DIMMs 2200 and 2300 through a data (DATA) line. The host 2100 provides a command or an address to the first and second DIMMs 2200 and 2300 through a command/address (CMD/ADDR) line.

The first and second DIMMs 2200 and 2300 are connected with the host 2100 through the data line and the command/address line. Each of the first and second DIMMs 2200 and 2300 may include an unbuffered dual in-line memory module (UDIMM), a registered DIMM (RDIMM), a load reduced DIMM (LRDIMM), Non Volatile DIMM (NVDIMM), etc. Below, it is assumed that each of the first and second DIMMs 2200 and 2300 includes an UDIMM structure. In FIG. 12, the memory system 2000 is illustrated as including two DIMMs. However, embodiments of the inventive concept may not be limited thereto. For example, the memory system 2000 may include three or more DIMMs or only one DIMM.

The first DIMM 2200 may include a first rank Rank1. A rank refers to a unit of a plurality of memory devices MD that are controlled by one chip select signal (not illustrated). The first rank Rank1 of the first DIMM 2200 may include a plurality of memory devices MD. Below, for ease of description, a first memory device 2210 among the memory devices MD included in the first rank Rank1 will be described as an example.

The second DIMM 2300 may include a first rank Rank1. The first rank Rank1 of the second DIMM 2300 may include a plurality of memory devices MD. Below, for ease of description, a second memory device 2310 among the memory devices MD included in the first rank Rank1 will be described as an example.

In FIG. 12, the first rank Rank1 of each of the first and second DIMMs 2200 and 2300 is illustrated as including four memory devices MD. However, embodiments of the inventive concept may not be limited thereto. For example, the first rank Rank1 may include memory devices MD, the number of which is less than "4", or may include memory devices MD, the number of which is more than "4". Also, each of the first and second DIMMs 2200 and 2300 may be configured to include two or more ranks.

First and second memory devices 2210 and 2310 may store data provided from the host 2100 through the shared data line or may provide data to the host through the shared data line. Each of the first and second memory devices 2210 and 2310 may be implemented with any storage medium that includes a memory that performs a read operation, a write operation, etc. in response to a command and an address provided from the host 2100. The above-described memory may include a volatile memory or a nonvolatile memory. A configuration in which the first and second memory devices 2210 and 2310 are connected with the host 2100 through the shared data line will be more fully described with reference to a side view of FIG. 13.

The first memory device 2210 may include a transmitter 2211 and a mode register 2212, and the second memory device 2310 may include a transmitter 2311 and a mode register 2312. Configurations and operations of the transmitters 2211 and 2311 and the mode registers 2212 and 2312 are similar to those described with reference to FIGS. 1 and 3. However, unlike the embodiment of FIGS. 1 and 3, each of the first and second memory devices 2210 and 2310 has a loading condition in which each of the transmitters 2211 and 2311 is connected with a receiver (not illustrated) of the host 2100 and a receiver (not illustrated) of one memory device. Also, compared with the embodiment of FIGS. 1 and 3, each of the mode registers 2212 and 2312 stores a loading condition of the corresponding one of the first and second memory devices 2210 and 2310 and information of a slew rate combination corresponding to an operation frequency, not information of a slew rate combination corresponding to an output resistance value of a main driver (not illustrated) and a resistance value of an on-die termination circuit of the host 2100.

Compared with the memory device 1200 of the memory system 1000 of FIG. 1, each of the first and second memory devices 2210 and 2310 of the memory system 2000 of FIG. 12 has a loading condition in which each of the transmitters 2211 and 2311 is further connected to one memory device. Accordingly, under a condition of the same output resistance value as the memory device 1200 of FIG. 1 and a resistance value of the on-die termination circuit, the first and second memory devices 2210 and 2310 provides the host 2100 with the output data of which a slew rate is lower than that of the output data of the embodiment of FIG. 1.

In general, a high-frequency component of a signal is attenuated and transferred due to a limited bandwidth of a channel. Also, the attenuation of the high-frequency component due to the limited bandwidth of the channel may increase by the increased loading condition. Accordingly, in the case where each of the first and second memory devices 2210 and 2310 has a loading condition added to each of the transmitters 2211 and 2311, compared with a loading condition illustrated in FIG. 1, the attenuation of the high-frequency component of the output data may become larger as the operation frequency of the memory system 2000 becomes higher. This results in a decrease in a slew rate of the output data. With the above description, in the case where the slew rate of the output data decreases due to the above-described loading condition and an increase in an operation frequency, the signal integrity (SI) of the output data signal may decrease, and thus, the magnitude of the valid data window may decrease.

The memory system 2000 of FIG. 12 may calibrate the slew rate of the output data based on the operation frequency and the loading condition of each of the first and second memory devices 2210 and 2310, thereby improving the SI of the output data. A slew rate calibration method of the memory system 2000 will be described with reference to FIG. 16.

Embodiments of the inventive concept may not be limited to the above-described example and may be applied to the memory system 1000 of FIG. 1. That is, the slew rate of the output data may decrease even though an operation frequency of the memory system 1000 of FIG. 1 increases. To be the same as the embodiment of FIG. 12, the memory system 1000 of FIG. 1 may calibrate the slew rate of the output data based on the operation frequency of the memory device 1200, to allow the magnitude of the valid data window of the output data to increase.

Figure 13:
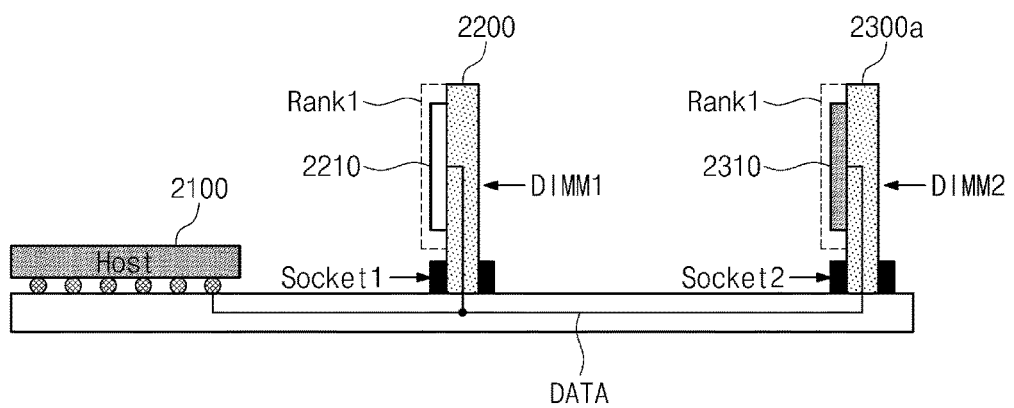
FIG. 13 is a side view for describing a loading condition of a memory system of FIG. 12 according to example embodiments.

FIG. 13 is a side view for describing a loading condition of a memory system of FIG. 12 according to example embodiments. The side view of FIG. 13 will be described with reference to FIG. 12. Referring to FIG. 13, the first memory device 2210 of the first rank Rank1 in the first DIMM 2200 and the second memory device 2310 of the first rank Rank1 in the second DIMM 2300a are illustrated.

The first and second memory devices 2210 and 2310 may be connected with the host 2100 through one shared data line. For example, the data line may be implemented with a printed circuit board (PCB) trace. The first and second DIMMs 2200 and 2300 are respectively connected with data line through first and second sockets Socket1 and Socket2 and the PCB trace. Each of the first and second memory devices 2210 and 2310 communicates with the host 2100 through the shared data line.

As described above, unlike the memory system 1000 of a 1 DCP structure illustrated in FIG. 1, the memory system 2000 of the 2 DPC structure has an increased loading condition in which each of the first and second memory devices 2210 and 2310 is connected with the host 2100 and one memory device.

Also, in the case where the first DIMM 2200 or the second DIMM 2300 has a 2-rank structure, compared with a memory system including a DIMM of a 1-rank structure, the first and second memory devices 2210 and 2310 may have the increased loading condition. A configuration of the DIMM including the 2-rank structure will be described with reference to FIGS. 14 and 15 as an example of the second DIMM 2300.

Figure 14:
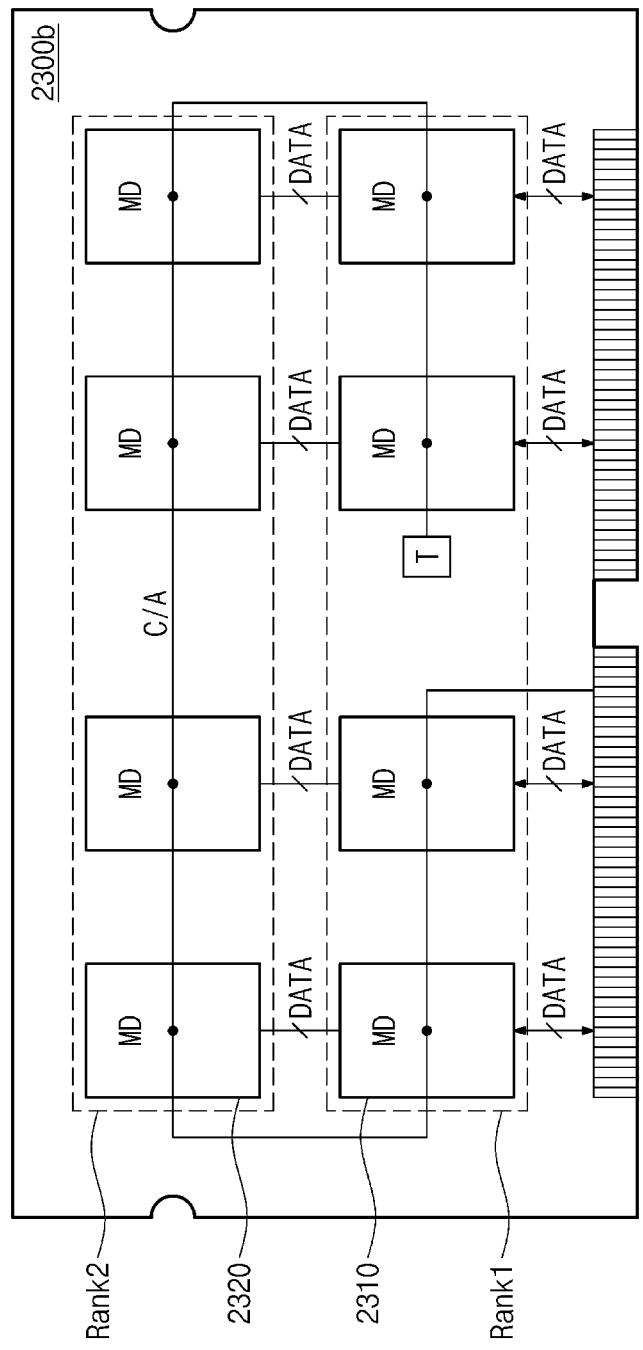
FIG. 14 is a drawing illustrating a second DIMM illustrated in FIG. 12, according to another embodiment of the inventive concept.

FIG. 14 is a drawing illustrating a second DIMM illustrated in FIG. 12, according to another embodiment of the inventive concept. The drawing of FIG. 14 will be described with reference to FIG. 12. Referring to FIG. 14, a second DIMM 2300b may include first and second ranks Rank1 and Rank2. Each of the first and second ranks Rank1 and Rank2 may include four memory devices MD. The second DIMM 2300b may include an UDIMM structure. The first DIMM 2200 of FIG. 12 may include the same structure as the 2-rank structure of the second DIMM 2300b of FIG. 14.

Each of the memory devices MD of the first and second ranks Rank1 and Rank2 exchanges data with the host 2100 in a point-to-point scheme. That is, the four memory devices MD of the first rank Rank1 exchange data with the host 2100 through the respective data lines. The four memory devices MD of the second rank Rank2 exchange data with the host 2100 through the respective data lines. Also, memory devices MD, which are located in the same column, of the memory devices MD of the first and second ranks Rank1 and Rank2 are connected to each other through the shared data line. That is, for example, a first memory device of the first rank Rank1, which is the second memory device 2310, is connected with a first memory device of the second rank Rank2, which is a third memory device 2320. If necessary, each of the eight memory devices MD may include on-die termination (ODT) for impedance matching with the data line.

Also, each of the eight memory devices MD is provided with the command/address C/A from the host 2100 of FIG. 12 in a fly-by scheme. That is, each of the memory devices MD is provided with the command/address C/A through a C/A signal line. The second DIMM 2300b may include an off-chip termination resistor for impedance matching with the C/A signal line. A loading condition of the memory system 2000 including the second DIMM 2300b of the 2-rank structure will be described with reference to a side view of FIG. 15.

Figure 15:
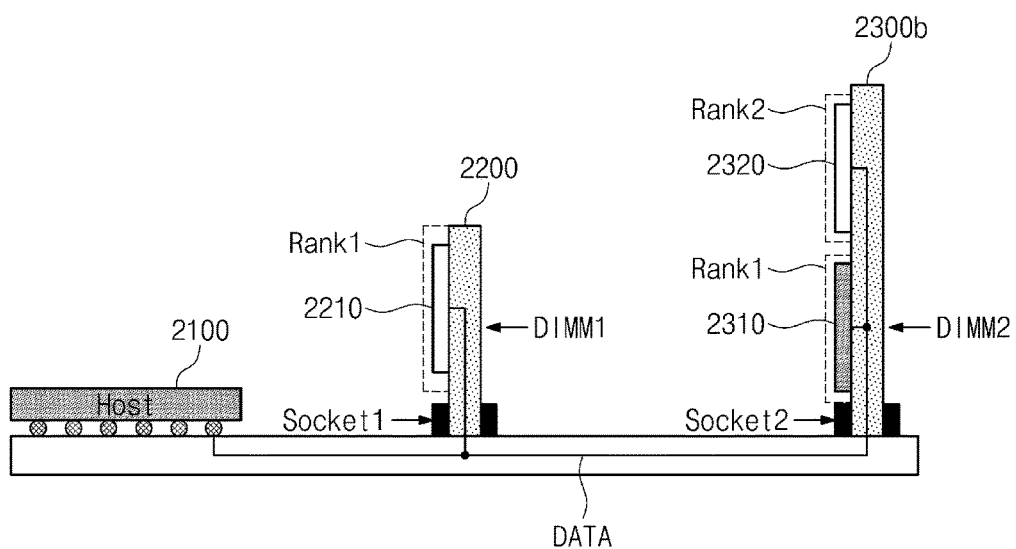
FIG. 15 is a side view illustrating a memory system including a second DIMM of FIG. 14 according to example embodiments.

FIG. 15 is a side view illustrating a memory system including a second DIMM of FIG. 14 according to example embodiments. The side view of FIG. 15 will be described with reference to FIG. 12. Referring to FIG. 15, the first memory device 2210 of the first rank Rank1 in the first DIMM 2200, the second memory device 2310 of the first rank Rank1 in the second DIMM 2300*b*, and the third memory device 2320 of the second rank Rank2 in the second DIMM 2300*b* are illustrated.

Each of the first, second, and third memory devices 2210, 2310, and 2320 may be connected with the host 2100 through one shared data line. Like an example of FIG. 13, a data line may be implemented with the PCB trace. Each of the first and second DIMMs 2200 and 2300*b* is connected with the data line through the corresponding one of the first and second sockets Socket1 and Socket2 and the PCB trace. Each of the first, second, and third memory devices 2210, 2310, and 2320 communicates with the host 2100 through the shared data line.

Compared with the memory system 2000 including the second DIMM 2300*a* of the 1-rank structure, the memory system including the second DIMM 2300*b* of the 2-rank structure has an increased loading condition in which each of the first, second, and third memory devices 2210, 2310, and 2320 is connected with the host 2100 and two memory devices. Accordingly, by the increased loading condition, the output data of the memory system 2000 including the second DIMM 2300*b* of the 2-rank structure may have a decreased slew rate.

Figure 16:
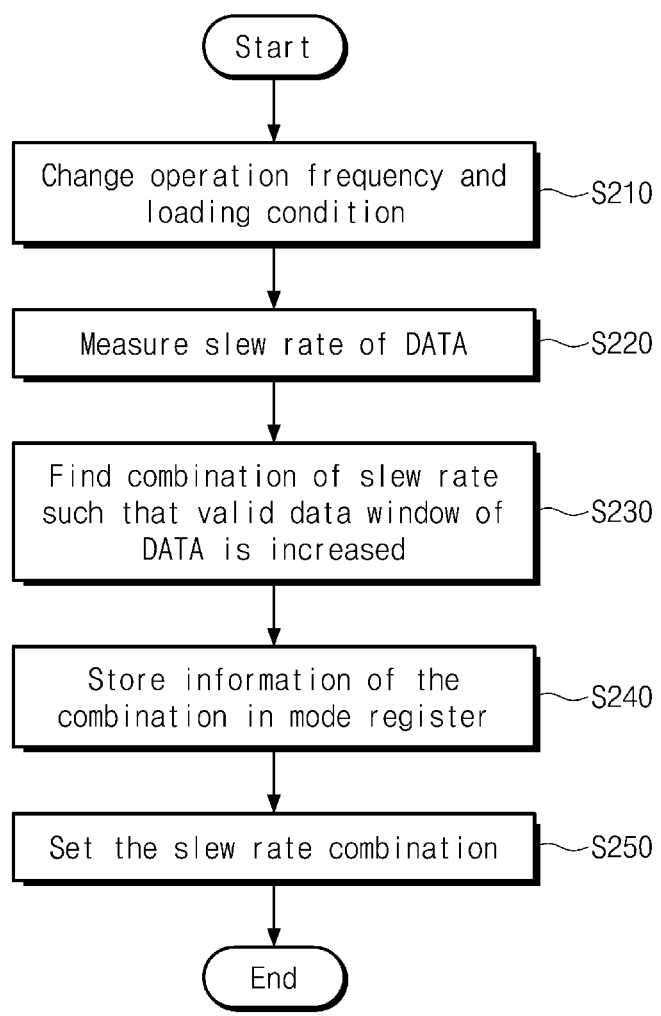
FIG. 16 is a flowchart for describing a method of calibrating a slew rate of a data signal in a memory system of FIG. 12, according to another embodiment of the inventive concept.

FIG. 16 is a flowchart for describing a method of calibrating a slew rate of a data signal in a memory system of FIG. 12, according to another embodiment of the inventive concept. The flowchart of FIG. 16 will be described with reference to FIG. 12. Referring to FIG. 16, the memory system 2000 may calibrate the slew rate of the output data such that the valid data window increases. The flowchart of FIG. 16 will be described by using the first memory device 2210 as an example. This is only one example, and a method corresponding to the flowchart of FIG. 16 may be identically applied to the second memory device 2310.

In operation S210, a loading condition and an operation frequency of the first memory device 2210 are changed. For example, the loading condition of the first memory device 2210 may be changed into a loading condition in which the first memory device 2210 corresponds to the host 2100 one to one like the memory system 1000 of FIG. 1. Also, the loading condition of the first memory device 2210 may include a loading condition of the 2 DPC structure including the DIMM of the 1-rank structure described with reference to FIGS. 12 and 13 or a loading condition of the 2 DPC structure including the DIMM of the 2-rank structure described with reference to FIGS. 14 and 15. In operation S220, the host 2100 measures a slew rate of the output data signal. The host 2100 measures slew rates of the rising and falling edges of the output data.

In operation S230, the host 2100 finds a slew rate combination of the rising edge and the falling edge of the output data to allow the valid data window of the output data signal to increase. For example, the host 2100 may find a slew rate combination in which a slew rate of the output data is higher than a reference slew rate. Also, the host 2100 may find a slew rate combination in which the valid time magnitude or the valid voltage magnitude of the output data is higher than a reference value.

In operation S240, the host 2100 generates information of a slew rate combination of the output data based on the measurement result obtained through operation S210 to operation S230 and stores the information of the slew rate combination in the mode register 2212 of the first memory device 2210. Operation S210 to operation S240 may be performed through a training process of the first memory device 2210. Alternatively, operation S210 to operation S240 may be performed in a test process of the first memory device 2210 after the first memory device 2210 is completely manufactured.

In operation S250, the first memory device 2210 calibrates the slew rate of the output data signal based on the information of the slew rate combination stored in the mode register 2212. The first memory device 2210 is provided with the loading condition and the operation frequency of the first memory device 2210 from the host 2100. The mode register 2212 detects information of a slew rate combination, which is matched with the operation frequency and the loading condition. The mode register 2212 provides the transmitter 2211 with the control signal CTRL[1:0] for implementing the detected slew rate information. The transmitter 2211 calibrates a slew rate of the output data signal based on the provided control signal CTRL[1:0]. Accordingly, the valid data window of the output data signal of the first memory device 2210 may increase.

Figure 17:
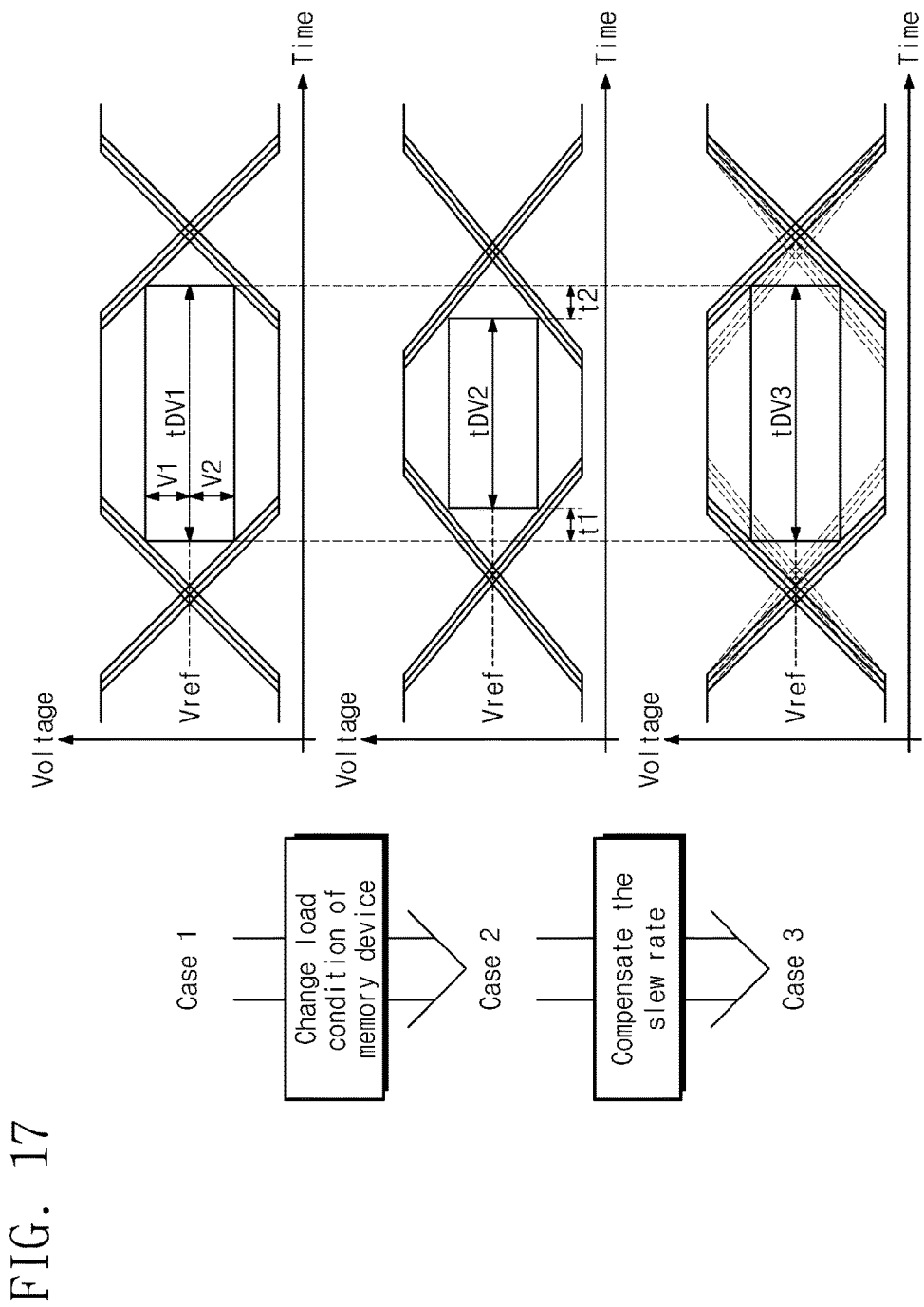
FIGS. 17 and 18 are drawings illustrating an output data signal when a memory system of FIG. 12 corrects a slew rate based on a change in the loading condition or the operation frequency by the slew rate calibration method of FIG. 16, according to example embodiments.
Figure 18:
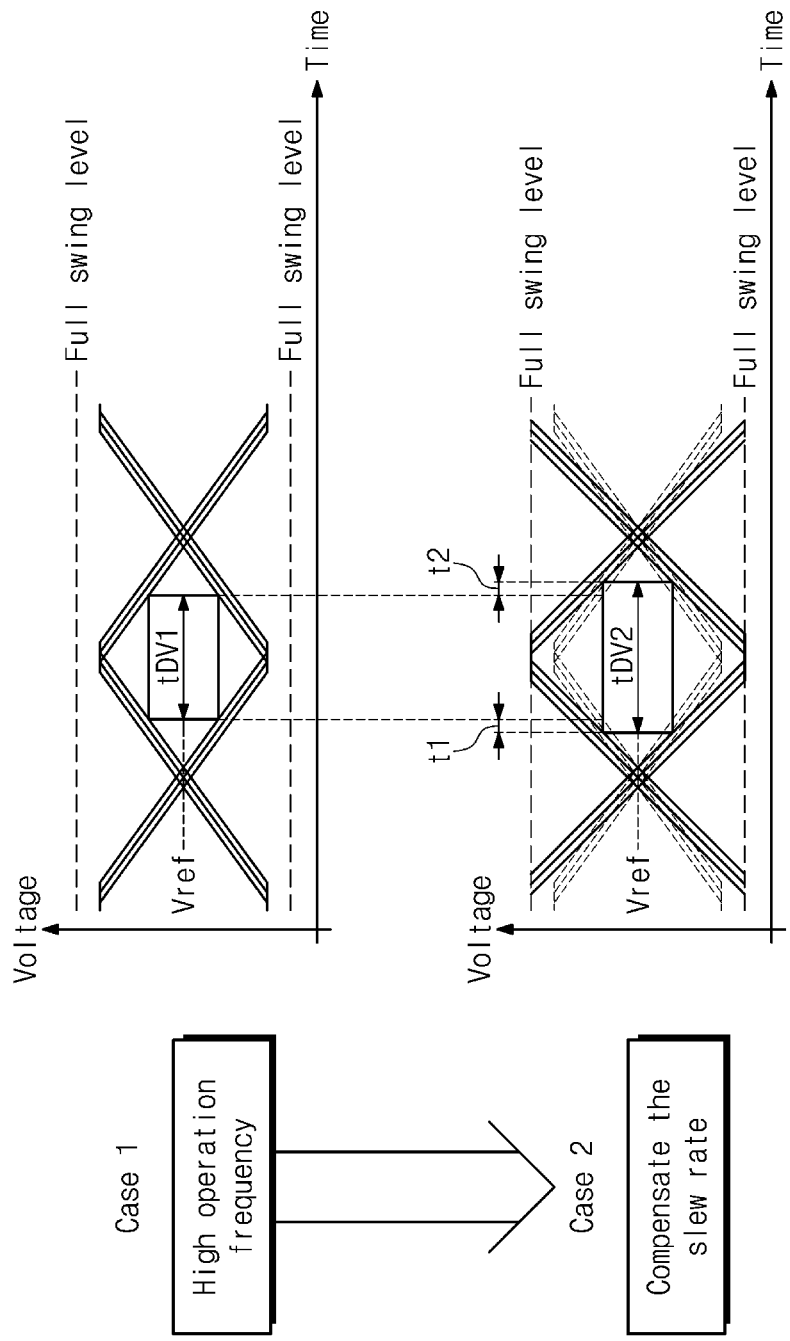

FIGS. 17 and 18 are drawings illustrating an output data signal when a memory system of FIG. 12 corrects a slew rate based on a change in the loading condition or the operation frequency by the slew rate calibration method of FIG. 16, according to example embodiments. The drawings of FIGS. 17 and 18 will be described with reference to FIGS. 12 and 16. Referring to FIGS. 17 and 18, an eye diagram of output data output by the first memory device 2210 is illustrated. FIGS. 17 and 18 will be described by using the first memory device 2210 as an example.

In a first case "Case 1" of FIG. 17, the valid data window of the output data has a first valid time magnitude tDV1 along a time axis. Like FIG. 12, the valid time magnitude may be defined as a time at which there is maintained a voltage section of the output data, in which a voltage of the output data is larger than the maximum voltage (Vref+V1) and is smaller than the minimum voltage (Vref−V2). In the first case "Case 1", the first memory device 2210 of the memory system 2000 operates in a first loading condition.

In the case where the loading condition of the memory system 2000 is changed (Case 2), a slew rate of the output data may change. For example, the loading condition of the first memory device 2210 included in the memory system 2000 may be changed into a second loading condition having more increased loading than the first loading condition. When the first memory device 2210 operates in the second loading condition, slew rates of the rising edge and the falling edge of the output data may decrease. In this case, by the decreased slew rates of the rising and falling edges, a second valid time magnitude tDV2 decreases by first and second times t1 and t2, thus becoming shorter than the first valid time magnitude tDV1.

In the case where the loading condition of the first memory device 2210 is changed into the second loading condition, the first memory device 2210 may calibrate a slew rate based on the method described with reference to FIG. 16 (Case 3).

First, the first memory device 2210 is provided with information of the loading condition thereof from the host 2100. The mode register 2212 detects information of a slew rate combination, which is matched with the corresponding loading condition and provides the transmitter 2211 with the control signal CTRL[1:0] corresponding to the detected information. The transmitter 2211 calibrates a slew rate of the output data signal based on the provided control signal CTRL[1:0]. As the slew rate is calibrated, the slew rate of the output data signal increases. Accordingly, a third valid time magnitude tDV3 formed by the corrected slew rate may be the same as the first valid time magnitude tDV1.

In a first case "Case 1" of FIG. 18, the valid data window of the output data has a first valid time magnitude tDV1 along a time axis. In the first case "Case 1", the first memory device 2210 of the memory system 2000 operates in a first operation frequency. In the case where the first operation frequency is larger than a bandwidth of a channel, a voltage level of the output data fails to reach a full swing level as illustrated in FIG. 18. Accordingly, since the slew rate of the output data is limited by the bandwidth of the channel, the output data has the first valid time magnitude tDV1 which has a small valid time magnitude due to the limited slew rate.

In example embodiments, as an example, each memory device may include a frequency detector (not shown) configured to detect an operation frequency of the memory device. As another example, the memory system 2000 may include the frequency detector configured to detect an operation frequency of the memory device.

In the case where the operation frequency of the first memory device 2210 increases, the first memory device 2210 may calibrate a slew rate based on the method described with reference to FIG. 16 (Case 2).

First, the first memory device 2210 is provided with the operation frequency thereof from the host 2100. The mode register 2212 detects information of a slew rate combination, which is matched with the corresponding operation frequency and provides the transmitter 2211 with the control signal CTRL[1:0] corresponding to the detected information. The transmitter 2211 calibrates a slew rate of the output data signal based on the provided control signal CTRL[1:0]. As the slew rate is calibrated, the slew rate of the output data signal increases. With the above description, the second valid time magnitude tDV2 formed by the corrected slew rate may increase by the first and second times t1 and t2, thus becoming larger than the first valid time magnitude tDV1. According to the embodiment of FIGS. 17 and 18, the memory system 2000 may improve the SI characteristic of the output data.

According to exemplary embodiments, a common voltage level of an output signal may be matched with a level of a reference voltage Vref by calibrating a slew rate under various signaling conditions. This may mean that the quality of the output signal is improved.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A memory device comprising:
   a main driver configured to provide an output signal to a host based on a driving signal; and
   a pre-driver configured to provide the main driver with the driving signal in order to calibrate a slew rate of the output signal based on an output resistance value of the main driver and a resistance value of an on-die termination circuit of the host.

2. The memory device of claim 1, wherein the pre-driver is configured to provide the main driver with the driving signal in order to calibrate the slew rate of the output signal to allow a common voltage level of the output signal to be matched with a level of a reference voltage of the host.

3. The memory device of claim 1, wherein the pre-driver generates the driving signal for calibrating the slew rate of the output signal based on a control signal.

4. The memory device of claim 3, further comprising:
   a mode register configured to store information of a slew rate combination that is generated based on the output resistance value of the main driver and the resistance value of the on-die termination circuit of the host and is provided from the host, and to provide the pre-driver with the control signal that is generated based on the information of the slew rate combination.

5. The memory device of claim 1, wherein the main driver comprises a structure for implementing an interface of a low voltage swing terminated logic (LVSTL) scheme, a pseudo open drain (POD) scheme, or a serial stub terminated logic (SSTL) scheme.

6. The memory device of claim 1, wherein the main driver comprises:
   a first pull up unit configured to pull up the output signal to a first driving voltage;
   a second pull up unit connected in parallel with the first pull up unit, and configured to pull up the output signal to the first driving voltage;
   a first pull down unit configured to pull down the output signal to a second driving voltage; and
   a second pull down unit connected in parallel with the first pull down unit, and configured to pull down the output signal to the second driving voltage.

7. The memory device of claim 6, wherein the pre-driver comprises:
   a pull up pre-driver configured to generate first and second pull up driving signals for driving the first and second pull up units, respectively; and
   a pull down pre-driver configured to generate first and second pull down driving signals for driving the first and second pull down units, respectively,
   wherein the driving signal comprise the first and second pull up driving signals and the first and second pull down driving signals.

8. The memory device of claim 7, wherein the pull up pre-driver comprises:
   a slew control circuit configured to calibrate the slew rate of the output signal by adjusting a time when the first pull up driving signal reaches the first pull up unit.

9. The memory device of claim 7, wherein the pull down pre-driver comprises:
   a slew control circuit configured to calibrate the slew rate of the output signal by adjusting a time when the first pull down driving signal reaches the first pull down unit.

10. A slew rate calibration method of a memory device, the method comprising:
    measuring, at a host, a common voltage level of an output signal of a main driver included in the memory device, by calibrating a slew rate of the output signal based on changes of an output resistance value of the main driver and changes of a resistance value of an on-die termination circuit included in the host; and
    storing information of a slew rate combination of the output signal, which is generated based on the measurement result, in a mode register included in the memory device.

11. The method of claim 10, wherein the measuring comprises:
    changing the output resistance value of the main driver and the resistance value of the on-die termination circuit;

measuring, at the host, the slew rate of the output signal; and finding the slew rate combination of the output signal to allow the common voltage level of the output signal to be matched with a level of a reference voltage of the host.

12. The method of claim 10, further comprising:

calibrating the slew rate of the output signal based on the information of the slew rate combination stored in the mode register.

13. The method of claim 12, wherein the calibrating comprises:

calibrating at least one of a falling edge and a rising edge of the output signal.

14. The method of claim 12, wherein the calibrating comprises:

calibrating the slew rate by calibrating a time at which a driving signal for driving the main driver reaches the main driver.

15. The method of claim 10, wherein the main driver comprises a structure for implementing an interface of a LVSTL scheme, a POD scheme, or a SSTL scheme.

16. A memory system comprising:

a memory device comprising a main driver and configured to calibrate a slew rate of an output signal that is generated by the main driver based on information of a slew rate combination; and a memory controller configured to measure a common voltage level of the output signal based on changes of an output resistance value of the main driver and changes of a resistance value of an on-die termination circuit of the memory controller, and to generate information of a slew rate combination of the output signal based on the measurement result to allow a common voltage level of the output signal to be matched with a level of a reference voltage of the memory controller.

17. The memory system of claim 16, wherein the main driver comprises a structure for implementing an interface of a LVSTL scheme, a POD scheme, or a SSTL scheme.

18. The memory system of claim 16, wherein the on-die termination circuit comprises a termination circuit of a POD termination scheme, a center tap termination (CTT) scheme, or a ground termination scheme.

19. The memory system of claim 16, wherein the memory device is configured to calibrate at least one of a rising edge and a falling edge of the output signal.

20. The memory system of claim 16, wherein the memory device comprises:

a mode register configured to store the information of the slew rate combination.

* * * * *